United States Patent [19]

Copeland et al.

[11] 4,295,198

[45] Oct. 13, 1981

[54] AUTOMATIC PRINTED CIRCUIT DIMENSIONING, ROUTING AND INSPECTING APPARATUS

[75] Inventors: Robert K. Copeland, Pennington; Richard J. Dimaggio, Trenton, both of N.J.

[73] Assignee: Cogit Systems, Inc., Princeton, N.J.

[21] Appl. No.: 26,436

[22] Filed: Apr. 2, 1979

[51] Int. Cl.³ .................... G05B 19/42; H04N 7/18
[52] U.S. Cl. .................... 364/515; 318/568; 358/101; 358/107; 318/568; 364/120; 364/491
[58] Field of Search .............. 364/120, 474, 514, 515, 364/518, 488–491; 358/106, 107, 101, 139, 903; 318/568, 577, 575, 640; 250/203 R, 203 CT, 202, 563, 572; 324/73 PC; 356/392, 393

[56] References Cited

U.S. PATENT DOCUMENTS

| | | | |
|---|---|---|---|
| 3,473,157 | 10/1969 | Little et al. | 318/577 X |
| 3,602,638 | 8/1971 | Pascoe et al. | 318/568 X |
| 3,716,716 | 2/1973 | Marantette et al. | 350/203 R |
| 3,790,704 | 2/1974 | Collomosse et al. | 358/101 X |
| 3,916,439 | 10/1975 | Lloyd et al. | 358/106 X |
| 3,920,972 | 11/1975 | Corwin et al. | 364/513 X |
| 3,936,712 | 2/1976 | Gerber et al. | 318/577 X |
| 4,010,356 | 3/1977 | Evans et al. | 364/474 |
| 4,056,716 | 11/1977 | Baxter et al. | 364/515 |
| 4,059,787 | 11/1977 | Aimar et al. | 318/568 |
| 4,118,730 | 10/1978 | Cemelson | 358/106 X |
| 4,148,065 | 4/1979 | Nakagawa et al. | 358/106 X |
| 4,163,212 | 7/1979 | Buerger et al. | 364/515 X |

OTHER PUBLICATIONS

"Star-Trak/Printed Circuit Board Tape Programmer and Inspection System"-Digital Systems Bulletin, No. 31475-1975.

Primary Examiner—Joseph F. Ruggiero
Attorney, Agent, or Firm—Richard C. Woodbridge

[57] ABSTRACT

An automatic apparatus is employed to recognize certain features on a printed circuit board and display that information on a screen so that an operator can create machine instructions for operations at those specific locations. Initially a printed circuit mask is placed on an X-Y table. A scanner automatically passes over the mask and searches for holes or other specific features. An interface system is employed to interface the scanner with a conventional computer. Several operations are employed to positively identify and locate a hole by size. Hole data is then checked to throw out duplicate information. Once the hole sizes are identified the information may be placed on a CRT screen. A machine operator then uses a stylus or other means to place machine instructions into memory at the location of the displayed features. The device may also be used to provide instructions to a routing machine or to compare a drilled printed circuit board with a previously scanned master negative.

24 Claims, 65 Drawing Figures

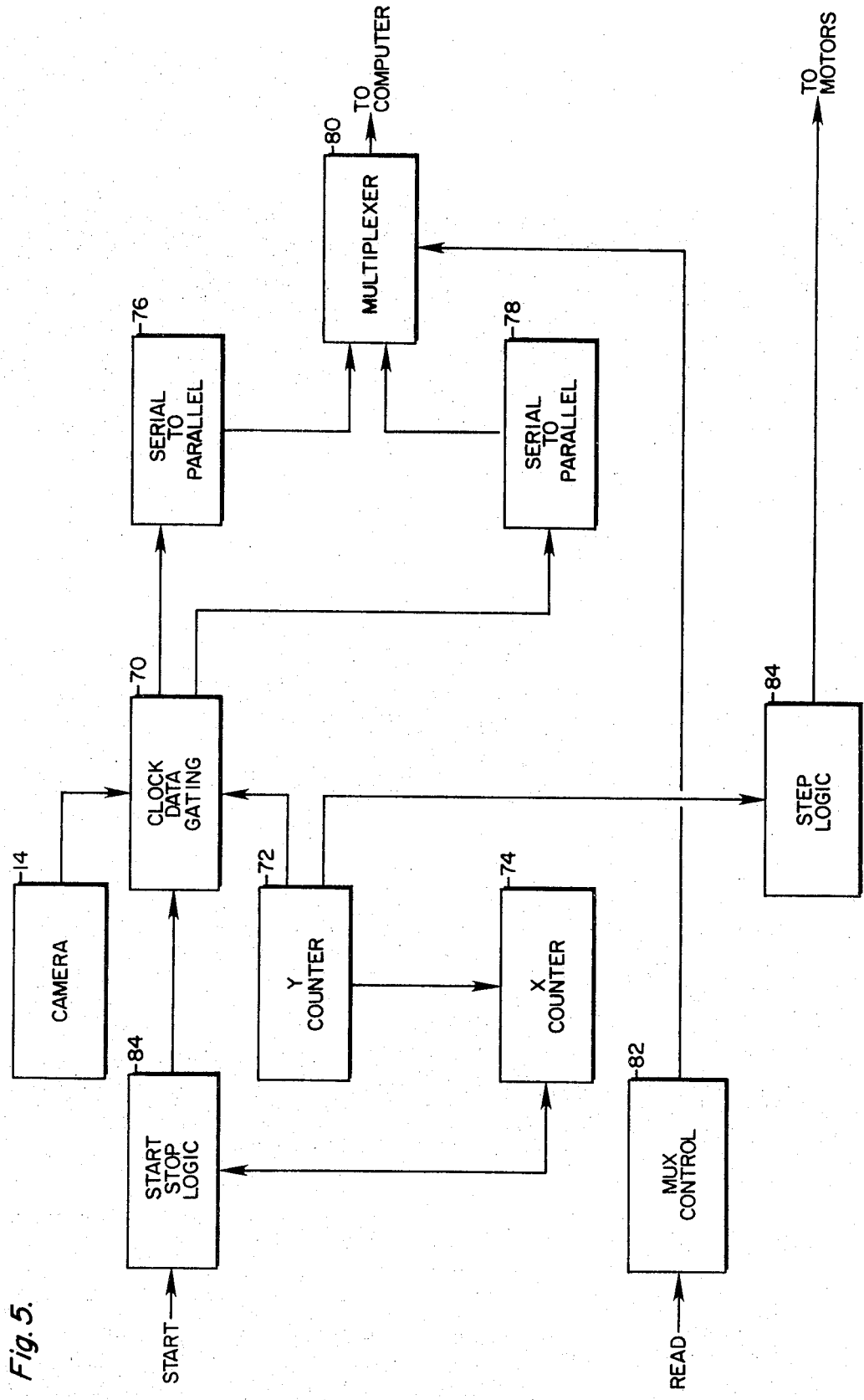

*Fig. 7I.*
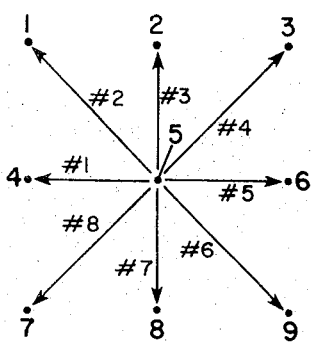
*Fig. 7K.*
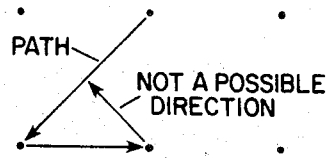
PATH
NOT A POSSIBLE DIRECTION
LAST TWO POINTS ON A POINT GRID ARE NOT ALLOWED DIRECTIONS.
*Fig. 7J.*
| DIR-ECTION | CURRENT POINT | NEW POINT | ADD NO. |
|---|---|---|---|
| 1 | 3,6,9 | 0 | 1 |
|   | 2,5,8 | 2,5,8,+1 |   |
|   | 1,4,7 | 1,4,7+1 |   |
| 5 | 1,4,7 | 0 | −1 |
|   | 3,6,9 | 3,6,9−1 |   |
|   | 2,5,8 | 2,5,8−1 |   |
| 3 | 7,8,9 | 0 | +3 |
|   | 4,5,6, | 4,5,6,+3 |   |
|   | 1,2,3, | 1,2,3+3 |   |
| 7 | 1,2,3 | 0 | −3 |
|   | 4,5,6 | 4,5,6−3 |   |
|   | 7,8,9 | 7,8,9−3 |   |
| 2 | 7,8,9,6,3 | 0 | +4 |
|   | ALL ELSE | +4 |   |
| 4 | 1,4,7,8,9, | 0 | +2 |
|   | ALL ELSE | +2 |   |
| 6 | 1,2,3,4,7, | 0 | −4 |
|   | ALL ELSE | −4 |   |
| 8 | 1,2,3,6,4 | 0 | −2 |
|   | ALL ELSE | −2 |   |

| BIT POSITION | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| 1 | | | | | | | | | | | | | | 0 | 0 | 0 | NO-OP |
| 2 | DIG LIGHTS | CAM LIGHT | CAM VAC | | | | | | | | | | | 0 | 0 | 1 | CAMERA START |
| 3 | HALF STEP | 2 WIND | RUN | BASE | CW CCW | STEP | HALF STEP | 2 WIND | RUN | BASE | CW CCW | STEP | N/A | 0 | 1 | 0 | DISCRETE CONTROL |
| 4 | HOME X | FOOT SWITCH | LIGHT FAIL | LIGHT HOME Y | | | | | | | | | | 0 | 1 | 1 | MOTOR CONTROL |
| 5 | | | | | | | | | | | | | | 1 | 0 | 0 | READ CAM DATA |
| | | | | | | | | | | | | | | 1 | 0 | 1 | READ ELSE |
| | | | | | X | | | Y | | | | | OPERATION DECOD | | | |

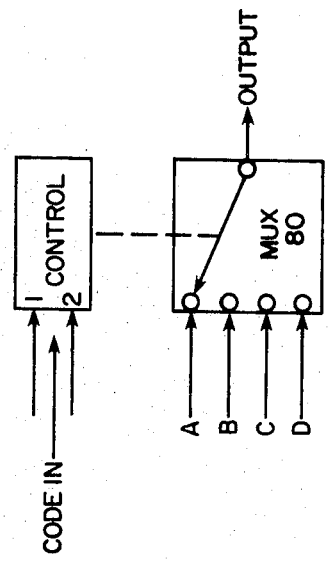
Fig. 15A.
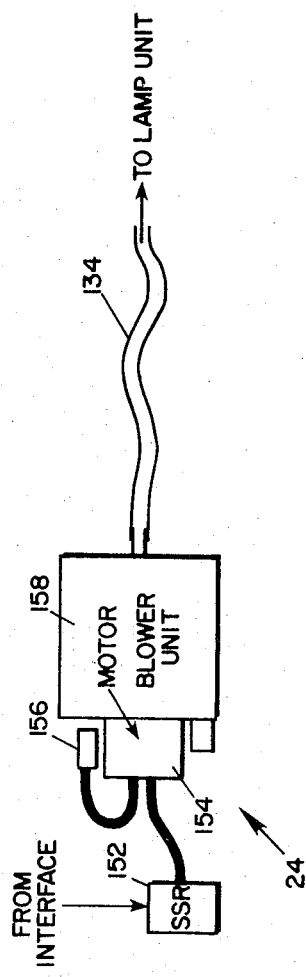
Fig. 15B.
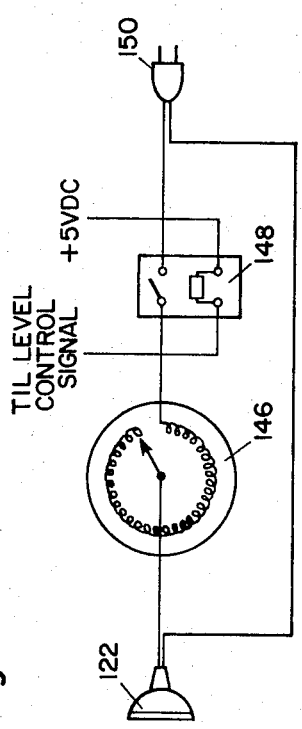
Fig. 13.
Fig. 14.

TV ALIGNMENT

RFS FOCUS CORRECTION

CALIBRATION POINTS EVERY 4 INS.

| EXIT | NEW DISPLAY | DELETE | MOVE TV | DISPLAY TOOL SIZE | MOVE CURSOR | CHANGE TOOL NUMBER | MOVE & REPLACE | INCR SCALE | RESET SCALE |
|---|---|---|---|---|---|---|---|---|---|

310

J1 OUT

| | A | B | C | D | |
|---|---|---|---|---|---|
| 1 | 7404 | 7474 | 7400 | 7474 | |
| 2 | 74121 | 74174 | 7408 | 74155 | |
| 3 | 74121 | HDR | CR120 SR1107 | 7493 | |
| 4 | 74257 | 74257 | 7474 | 7414 | |
| 5 | | | | | |
| 6 | | | | | |

J2 IN

| | A | B | C | D | |
|---|---|---|---|---|---|
| 1 | 7414 | 7414 | 7414 | 74257 | |
| 2 | 74164 | 74164 | 74157 | 74157 | |
| 3 | 74164 | 74164 | 74157 | 74157 | |
| 4 | 74164 | 74164 | 74157 | 74157 | |
| 5 | 74164 | 74164 | 74157 | 74157 | |
| 6 | 7404 | HDR | HDR | 311/311 | |

J3 I/O

| | A | B | C | D | |
|---|---|---|---|---|---|
| 1 | 7403 | 7404 | 7474 | 7414 | 1 |
| 2 | 7406 | 7402 | 7400 | 7493 | 2 |
| 3 | 7406 | 7404 | 7408 | 7493 | 3 |
| 4 | 7408 | 7408 | 7432 | 7439 | 4 |
| 5 | 7400 | 74121 | 74121 | 7493 | 5 |
| 6 | SWITCH | HDR | 74121 | 7493 | 6 |

AUTOMATIC PRINTED CIRCUIT DIMENSIONING, ROUTING AND INSPECTING APPARATUS

BACKGROUND OF THE INVENTION

1. Field of the Invention

This invention relates to an automatic device for scanning an object and producing machine instructions in response to certain features of the object and the commands of a machine operator.

2. Description of the Prior Art

There are devices known to those of ordinary skill in the art for scanning printed circuit boards or masks with the purpose of trying to better define features therein. For example, the Airmar et al reference, U.S. Pat. No. 4,059,787, discloses a method and apparatus to give a particular zone type printed circuit board a distinctive appearance with respect to surrounding areas on the surface of the printed board. The surface of the printed board is automatically scanned in a system of two rectilinear perpendicular coordinates by a device comprising at least one detector which is responsive to the distinctive appearance. The coordinates of the surface point for which the detector delivers a signal representing the presence of the distinctive appearance during the scanning are recorded in a coded form which can be later utilized. See column 1, lines 6-42 and column 6, lines 37-39. A linear photo-electric network consisting of photosensitive elements is aligned parallel to the Y axis and is used to scan a width of the circuit board and an X-Y table is used to effectuate relative displacement between the photo-electric network and the circuit board. See column 3, lines 24-27 and column 5, lines 20-24 and lines 47-50. A center-finding unit is employed to determine the coordinates of the center points of the holes to be drilled. See column 6, lines 19-24. Hole diameters are then determined by a diameter-selecting unit. See column 6, lines 22-25. The apparatus further includes a unit which serves to visualize the holes to be drilled. See column 6, lines 44-50.

Similarly, Baxter et al, U.S. Pat. No. 4,056,716 discloses an apparatus for scanning a manufactured circuit board and comparing it with a master pattern to produce signals representing the quality of the manufactured circuit board. See column 1, lines 10-12 and column 2, lines 11-14. The Baxter et al reference further discloses a transport which is used to carry the object to be inspected past a scanner. See column 2, lines 6-14.

The use of machinery to prepare tapes to operate numerically controlled machines is well-known to those of ordinary skill in the art. See, for example, Evans et al, U.S. Pat. No. 4,010,356 which discloses a tape preparation system for preparing tapes of the sort used to control numerically controlled machine tools and which includes a computer inter-connected to a visual display for the purpose of assisting in the preparation of the information stored on the tape.

It is further known to those of ordinary skill in the art to use a camera to scan a surface in order to locate point data. See for example, Pascoe et al, U.S. Pat. No. 3,602,638 which discloses such a system in conjunction with a specially programmed computer in order to prepare a control tape for a numerically controlled machine.

Digital Systems, Inc., a subsidiary of Resdel Industries, Arcadia, Calif., 91006 markets a printed circuit board tape programmer and inspection system under the mark Star—Trak. The system includes an "optical centering eye" which is in part the subject matter of U.S. Pat. No. 3,716,716. The system apparently works in the following manner. Positive circuit art work is placed on an X-Y table and duplicate art work is placed on an operator table. The operator moves a servo assisted locator stylus to a pad hole thereby causing the X-Y table to track the stylus movement. When the stylus reaches the pad area the "optical centering eye" takes over and centers the hole. An air button, or foot switch, is then pressed in order to punch the tape.

Many of the devices on the market that are used to produce tapes for numerically operated machinery require a great deal of dexterity and concentration on the part of the machine operator. An example of such a device is sold under the name Checkmate by Advance Controls, Santa Ana, Calif.

In general the prior art suffers from several drawbacks. First of all, they frequently rely to a great extent upon operator dexterity and alertness. Secondly, even the advanced types can be rather slow in their scanning abilities. Thirdly, their powers of recognition are often limited. And, fourthly, their operation is often limited to a single function such as the recognition of holes only or for the comparison of a master pattern with the object that has already been machined.

SUMMARY OF THE INVENTION

Briefly described the invention comprises an apparatus and method for recognizing certain features on a printed circuit board and then displaying that information on a CRT screen so that an operator can create machine instructions for those specific features at those specific locations. The instructions are subsequently used to direct the operations of a numerically operated machine such as a gang drill. Initially a printed circuit mask or similar object is placed upon an X-Y table. A Reticon ® camera is rigidly mounted above the surface of the table and adapted to scan the object. The output of the scanning camera is received by an interface circuit where the data pulses are converted from serial to parallel and then gated 16 at a time through a multiplexer circuit into a computer. The interface is of novel construction and is adapted to present a stream of data 16 bits wide into any one of a variety of conventional minicomputers. Once the information is in the computer the data is examined for holes. There are three basic hole searching techniques.

The first test, called the BURST test looks for a maximum diameter. If the diameter is larger than the maximum allowable diameter of the hole, the feature is not deemed to be a hole. 90% of all possible holes are eliminated by the burst test. The second test, the L-PATH test takes a series of up to six 90° moves in such a fashion that if the inspection point is outside of the allowable diameter of the circle during any one of the six moves, then the object is clearly not a hole and is discounted. Thirdly, if the feature passes the previous two tests, then the computer performs an enclosure test, or PATH test, to determine if the item is a circle.

Once the computer has identified the location of the holes and duplicate holes have been removed, the information is placed upon a CRT screen display. The operator can use a stylus or similar indicating device to tell the computer which holes or features, it wants to address. The computer is programmed to accept specific instructions at the location of identified holes. Those instructions might include drill size, depth of penetration, etc. Finally the information is put into the appropriate format so that a punch machine can product a tape suitable for running a conventional numerically operated machine, such as a gang drill.

These and other features of the invention will be more fully understood with reference to the following drawings and detailed description of the preferred embodiment.

BRIEF DESCRIPTION OF THE DRAWINGS

FIG. 5 is a block diagram illustrating the major components of the interface section 26.

FIGS. 7A-7K illustrate the three tests used to determine the presence of a hole.

FIG. 13 is a schematic of the electrical system for controlling the intensity of the line scan camera lamp.

FIG. 14 is a diagrammatic illustration of the vacuum motor control unit.

FIG. 15A is a schematic representation of a portion of the multiplexer unit.

FIG. 15B is a switching table illustrating the operation of the multiplexer unit illustrated in FIG. 15A.

DETAILED DESCRIPTION OF THE PREFERRED EMBODIMENT

During the course of this description like numbers will be used to indicate like elements according to the different figures illustrating the invention.

1. Equipment and General Operation

Figure 1:
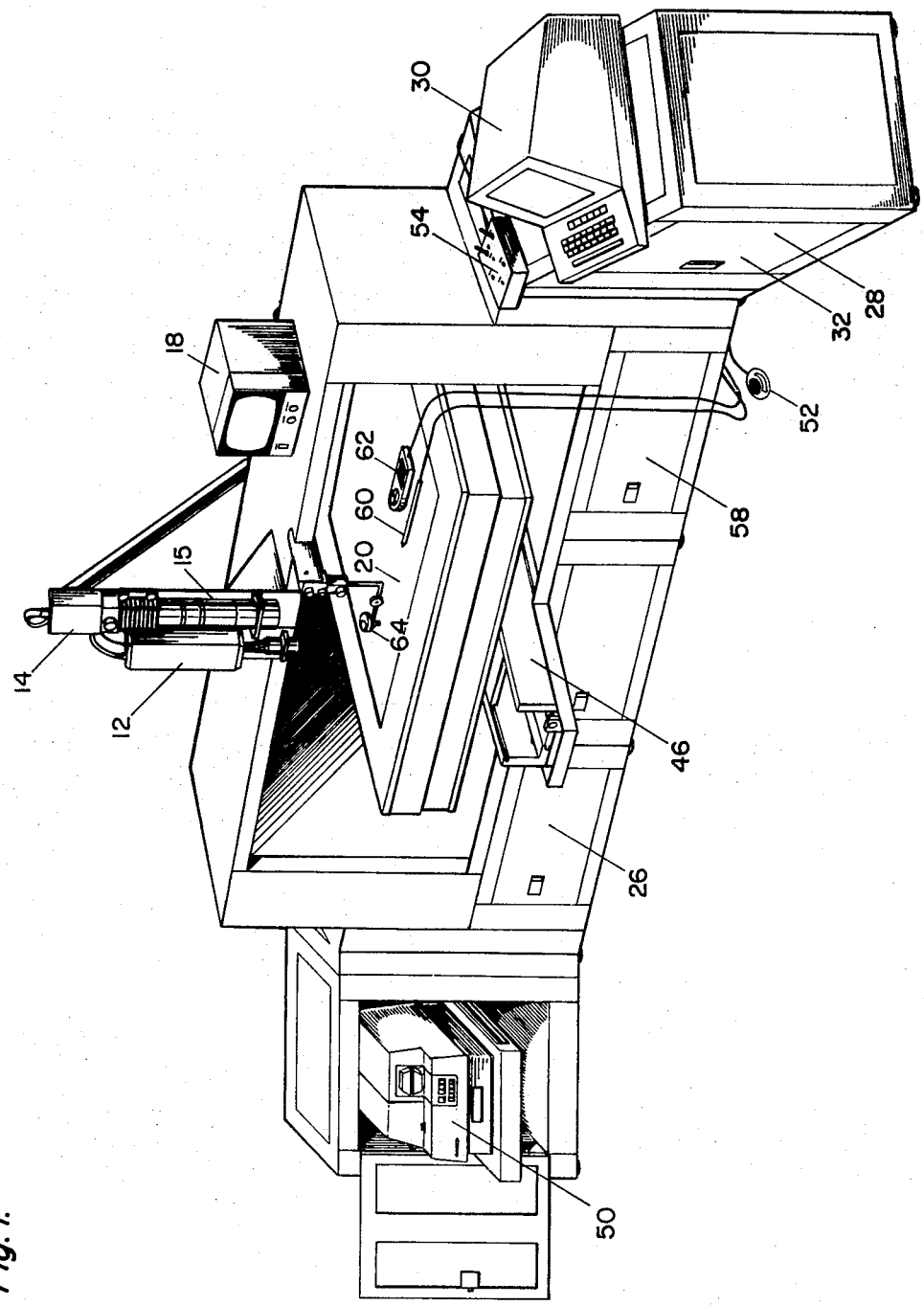
FIG. 1 is an isometric perspective view of the preferred embodiment of the invention.
Figure 2:
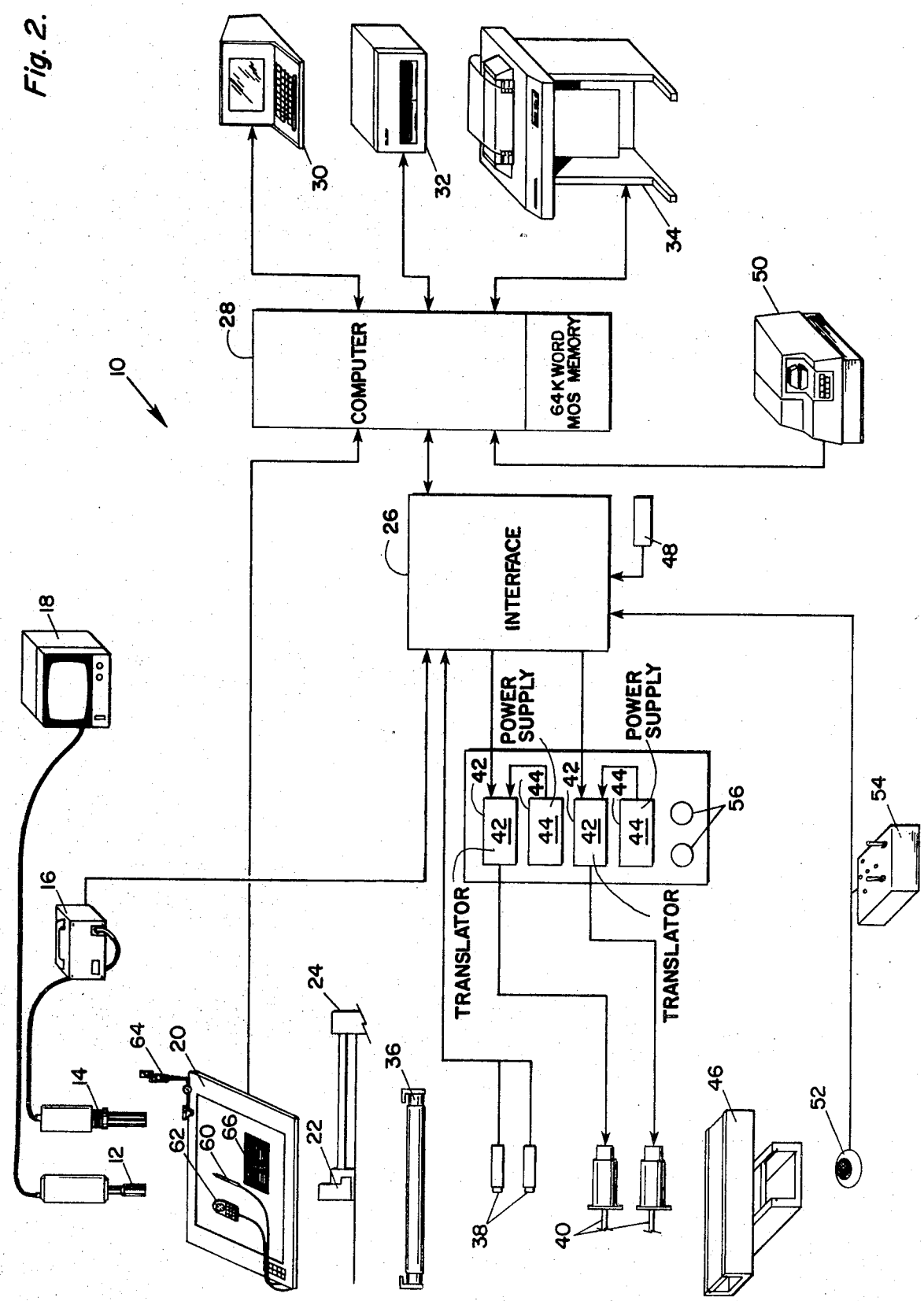
FIG. 2 is a block diagram showing the interrelationship between the major components of the invention.

FIGS. 1 and 2 illustrate the major components of the preferred embodiment of the present invention. Virtually all of the major components can be seen in FIG. 2 while some of the components are hidden from view in the perspective seen in FIG. 1.

The following is a list of the major components of the apparatus 10 as seen in FIG. 2:

| Element No. | Element | Model No. or Source |
|---|---|---|
| 12 | TV Camera | VTR MKY 11 GBC CCTV Corp. N.Y., N.Y. |
| 14 | Line Scan Camera | Reticon Model LC-600 Reticon Corp., Sunnyvale, Calif. |
| 15 | Zoom Lens | Cannon 100-200 mm-300 mm Model No. 61394 |
| 16 | Camera Power Supply | RS 600 A Reticon Corp., Sunnyvale, Calif. |
| 18 | TV Monitor | MV 10 A GBC CCTV Corp., N.Y., N.Y. |
| 20 | Digitizer Pad | BL-622B Talos Systems Scottsdale, Az. |
| 22 | Light Source (Lamp 122) | G.E. Projector bulb Model ENH |
| 24 | Blower/Power Supply | Motor - Herbach and Rademan Model No. TM 20K070; Blower - Lamb Electric Model No. 15540 |
| 26 | Interface | See FIGS. 5 and 6A-6L Cogit Systems, Princeton, N.J. |
| 28 | Computer and Internal Interface | Digital Equip. Corp. Model PDP 11/03, Maynard, Mass. |
| 30 | Graphics CRT | Model 4006-1 - Tektronics, Beaverton, Ore. |
| 32 | Floppy Disc Drive | Model RX - Digital Equip. Corp. Maynard, Mass. |
| 34 | Line Printer | Model LA 180 - Digital Equip. Corp. Maynard, Mass. |
| 36 | Digitizer Light Ass'y | Cogit Systems, Princeton, N.J. |

-continued

| Element No. | Element | Model No. or Source |
|---|---|---|
| | (Fluorescent Lighting) | Lights G.E. Model No. F15T8-CW; balasts G.E. Model No. 8G3912. |
| 38 | Home Sensors | Dennison Model No. NJ 1.5-8GM-N |
| 40 | Stepping Motor | MO62 FC09E - B&B Motor, N.Y., N.Y. |
| 42 | Translator | STM 103 - Superior Electric Co. Bristol, Conn. |
| 44 | Power Supply | MPS 3000 - Superior Electric Co. Bristol, Conn. |
| 46 | X-Y Table | Anoride 7 - Anorad Corp. Smithtown, N.Y. |
| 48 | +5 Volt Logic Power Supply | #LJG-10.50V Lambda Electronics Rochester, N.Y. |
| 50 | Reader/Punch | 1560-AS - Sweda Int'l Inc. Pine Brook, N.J. |
| 52 | Footswitch | L2-014 - Linemaster Switch Corp. Woodstock, Conn. |
| 54 | Switch Box | Bud Industries, Inc. Willoughby, Ohio |
| 56 | Cooling Fan | #8500 C Pamotor, Burlingame, Cal. |
| 58 | Drawer Assembly | Augat, Inc. Attleboro, Mass. |
| 60 | Pencil Stylus | Talos Systems Scottsdale, Ariz. |
| 62 | Crosshair Cursor | Talos Systems Scottsdale, Ariz. |
| 64 | Machine Dwell Meter | L.S. Starrett Co. Athol, Mass. |

The interrelationship of the foregoing elements will be better understood by the following brief description of the operation of the invention. A more detailed description of the operation follows in a subsequent section of this disclosure.

Figures 21, 22, 23:
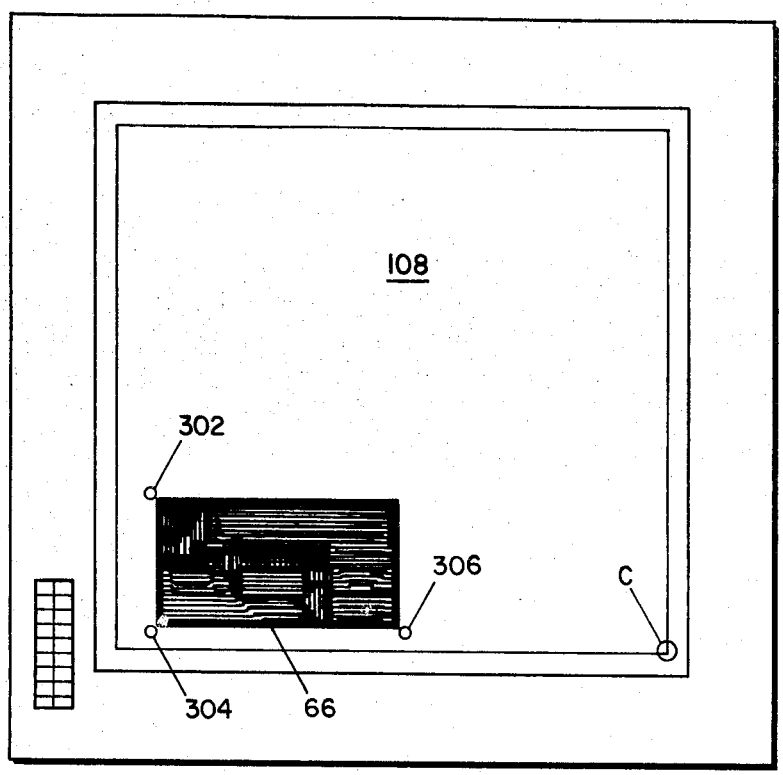
FIG. 21 illustrates the manner in which a printed circuit board is attached to the digitizer pad prior to machine operation.
FIG. 22 illustrates the input keyboard buttons of the CRT monitor.
FIG. 23 is a table of the integrated circuits shown in FIGS. 6A-6L.

Initially, according to the preferred embodiment of the invention, a printed circuit mask 66 is placed upon digitizer pad 20 and affixed thereto with tape. See also FIG. 21. Certain calibration values are then entered into the computer 28 by stylus 60 or 62. Once the apparatus is set up the camera 14 scans the mask 66 and feeds serial data information into interface circuit 26. As indicated in FIG. 1, the TV camera 12 is offset from the scanning camera 14 but parallel thereto. The scanning camera sweeps across the object 66 and provides a string of data pulses. Interface 26 converts the serial data from the scanning camera 14 into a series of pulses 16 bits wide. The pulses are gated into computer 28 where they are stored in memory for subsequent processing.

The digitized pad 20 is generally lit from below by fluorescent light 36. A point light source 22 is located directly below scanning camera 14 and is cooled by the blower/power supply assembly 24. Digitized Pad 20 is mounted on a conventional X-Y table cross-frame assembly 46 and it has its X and Y components respectively controlled by stepping motors 40. Typically a lead screw, not shown, is employed to position X-Y table 46. Stepping motors 40 are controlled by translators 42 which in turns receive their instructions through interface circuit 26. Translators 42 receive their power from supply units 44. Power supply units 44 and translators 42 are housed within a drawer assembly 58 which is cooled by a pair of fans 56. The X-Y table 46 receives its signal to advance and to stop from computer 28. The signal to advance is not given until such time as the computer 28 has digested and stored the information previously transmitted to it from camera 14. A 5 volt logic power supply 48 supplies interface assembly 26 with the necessary electrical power.

Computer unit 28 includes its own internal 64 K byte RAM MOS memory. In addition a separate floppy disc memory 32 is employed to store the long term data generated by computer 28. Once the computer 28 has determined the location of hole, or other specific features on the circuit board 66, the information is displayed on CRT 30. CRT 30 includes a keyboard 310 (See FIG. 22) so that the computer 28 can be instructed to perform certain specific operations. The output of the computer 28 may also be reproduced on line printer 34. Once the operator has interacted with the computer 28 via CRT terminal 30 and the machine instructions have been designated at the specific hole locations, the output can then be printed by a 244 reader/tape punch 50. The operator can designate which hole, or other feature, he wishes to examine on CRT 30 by means of a cursor or dot controlled by foot switch pedal 52 or X-Y control switch box 54. The details of the operation of the apparatus are discussed in a subsequent section of this disclosure.

2. Detailed Structure

The purpose of interface 26 is to electrically control the signals to a conventional parallel input/output DRV11 interface card in computer 28 to and from the following elements:
1. Stepping Motors 40;
2. Home Sensors 38;
3. Digitizer Light Control (on/off) (See FIGS. 11A and 11B);
4. Line Scan Camera Light Control (on/off) (See FIG. 13);
5. Line Scan Camera Light Vacuum Motor Control (on/off) (See FIG. 14);
6. Line Scan Camera Data Input/Formator;
7. Table Positioning Switch Box Input 54;
8. Footswitch input 52;
9. Light Fail Detector (See FIGS. 19A-19C).

Connections between interface 26 and computer 28 are made through a 40 conductor flat cable where every other line is grounded to reduce E.M.I. The signals to/from the DRV11 (D.E.C. Standard Parallel In/Out Card) 28 are as follows:

1. Sixteen (16) data bits—
   plus 5 VDC=logic 1=TRU=ON
   GROUND=logic 0=FALSE=OFF
2. Three (3) control lines as follows—
   A. Initialize ("INIT")=reset to predetermined state;
   B. Data Transmit (DT)=the 16 data bits on the signal bus have been accepted by the computer
   C. New data bit ready ("NDR")=the 16 data bits on the signal bus are valid and the interface 16 should treat their contents as an operation to be completed or performed.
3. Two (2) Interrupt Lines ("A & B")—alerts processor of data in a state ready to be read.

Figures 8A, 8B, 9:
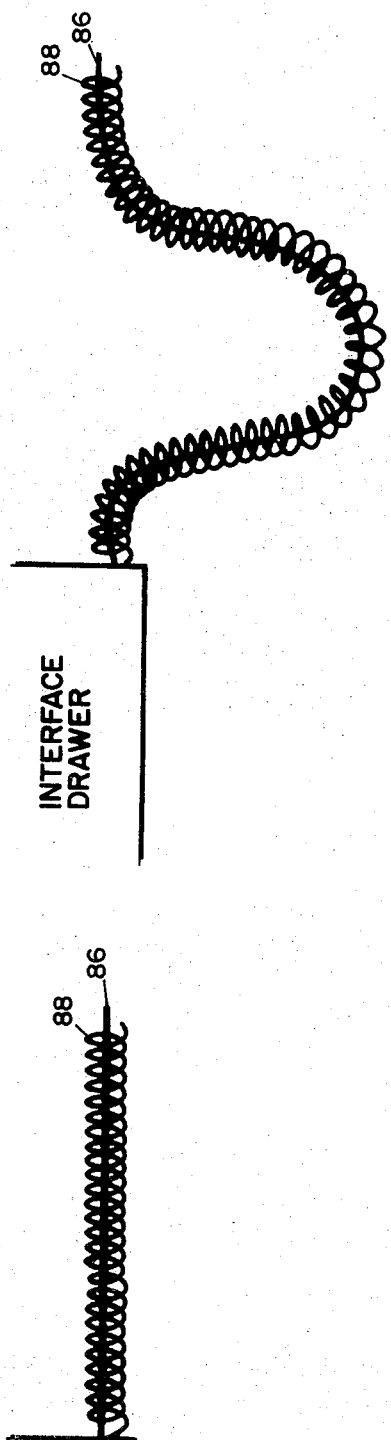
FIGS. 8A and 8B illustrate the manner in which the interface is electrically and optically connected to the scanning equipment.
FIG. 9 is a table of the 16 bit data words received from the computer.
Figure 19C:
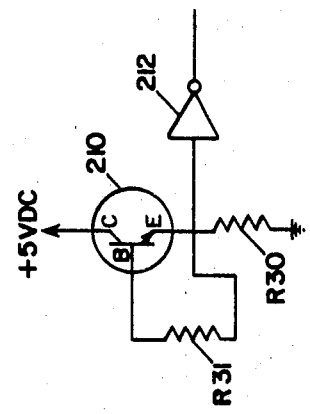
FIGS. 19A-19C illustrate the light fail detector mechanism and its associated electronic circuitry.
Figure 19A:
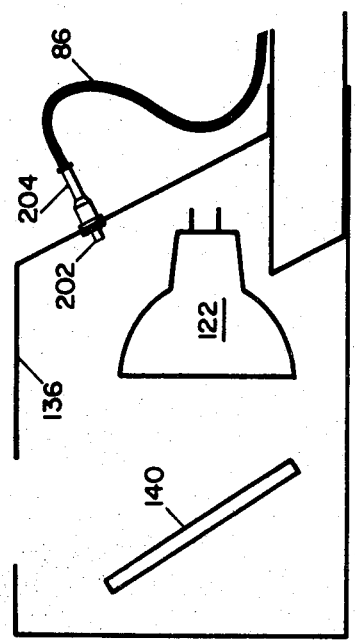
Figure 19B:
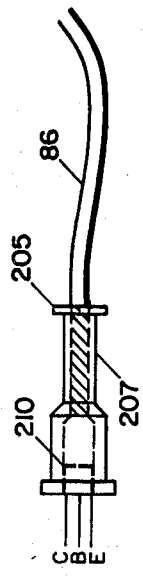

The operating voltage to interface 26 is supplied by conventional plus 5 VDC power supply. The circuitry of interface 26 can be housed or built on a general purpose wire wrap printed circuit board. The connections to and from the DRV11 card in computer 28 are made through the 40 conductor cable previously described. The cable includes a removable connector at both ends. The printed circuit board resides on a slide mounted enclosure, cooled by two muffin-type fans rated at 43 cubic feet per minute each. Connections to and from all other devices, with the exception of the line scan camera fail light detector are through retractable cord 88 anchored at the rear of the interface enclosure rack. The connection to the line scan camera light fail detector described in FIGS. 19A through 19C is through a multifilament, quartz fiberoptic cable 86 which travels through the center of the retractable cord coil 88. FIG. 8A illustrates the relationship of fiberoptic cable 86 to the retractable cord 88 when the cord 88 is in the extended state. FIG. 8B illustrates the same item in the retracted state.

The table in FIG. 9 discloses the manner in which the 16 data bit words are received from computer 28. The data bits 0, 1 and 2 are decoded for the following five different operations:

1. NO-OP (No operation);
2. CAMERA START—To start or allow the next active block of data from the line scan camera 14 to input one (1) block is 512 data bits repeated 200 times);
3. MOTOR CONTROL—Transmit necessary signals to translator modules to correct motor operation;
4. READ CAMERA DATA—This operation chooses the correct multiplexed path for the data to flow from the line scan camera 14 to the DRV11 card;
5. READ ELSE—This chooses the correct multiplex path for data to travel from the following elements to the DRV11 card Home sensors 38; switchbox 54; foot switch 52 or the lamp fail sensor 210.

Most electronic circuitry is designed for use with 7400 series logic gates. Element designations are given in FIG. 23.

Figure 6A:
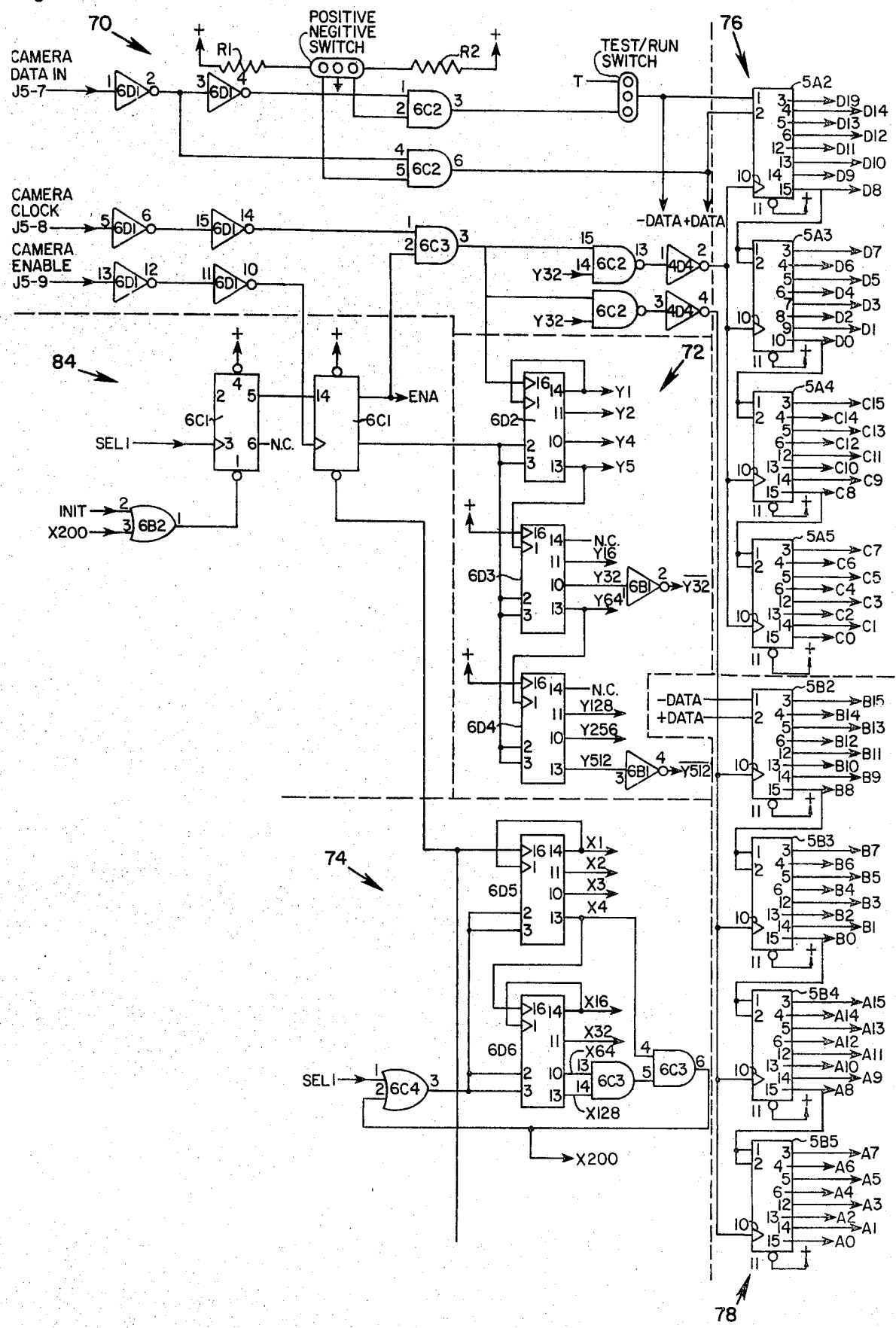
FIGS. 6A-6L comprise a detailed schematics of the components of interface 26.
Figure 6B:
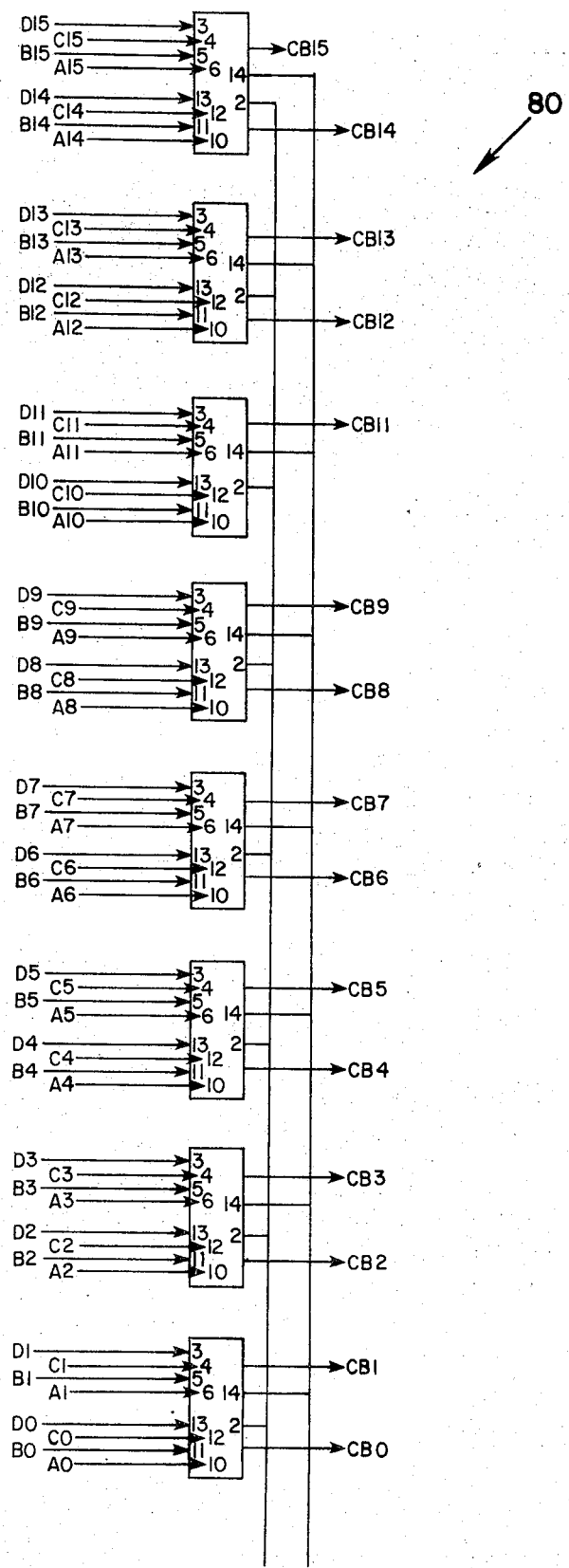
Figure 6C:
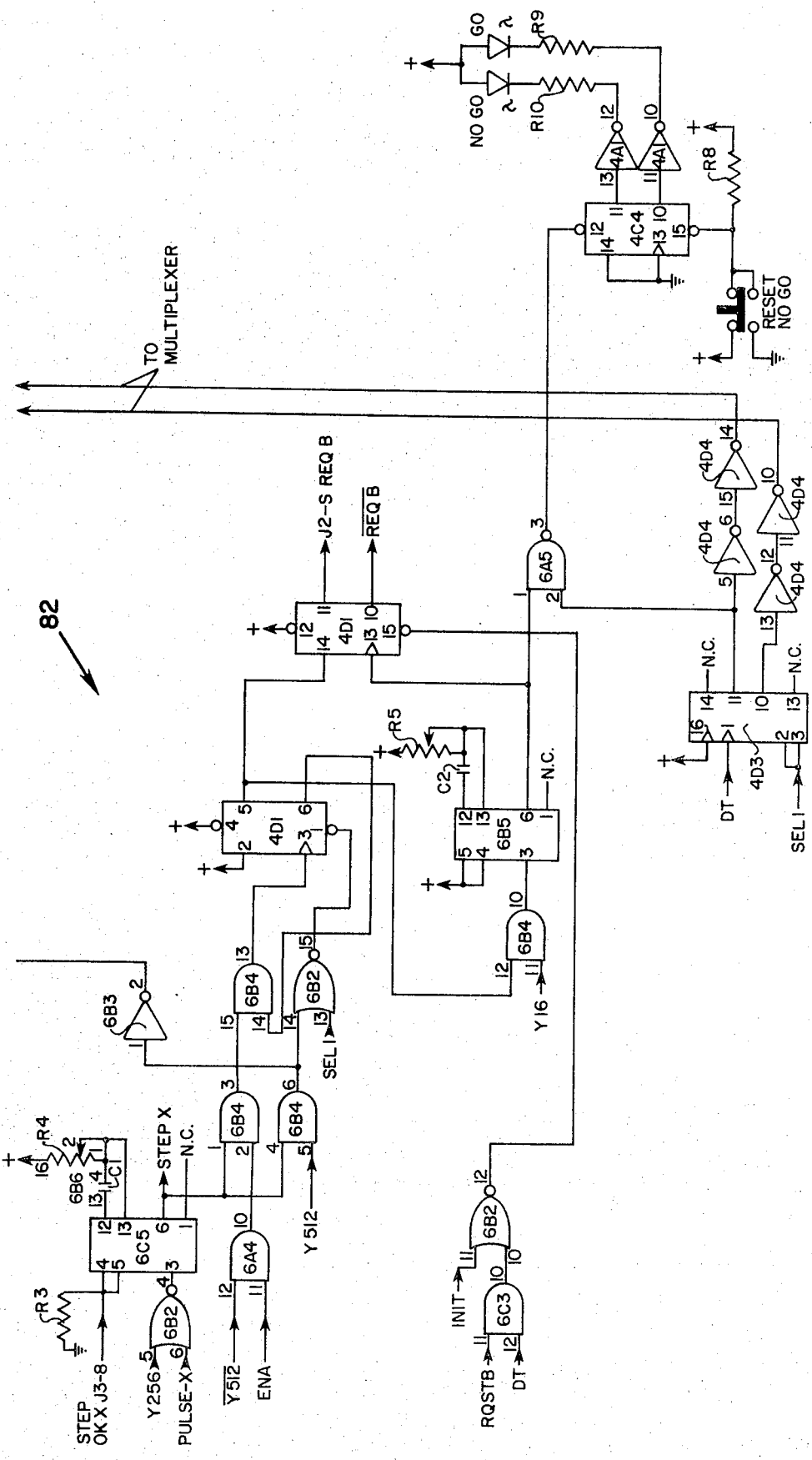
Figure 6E:
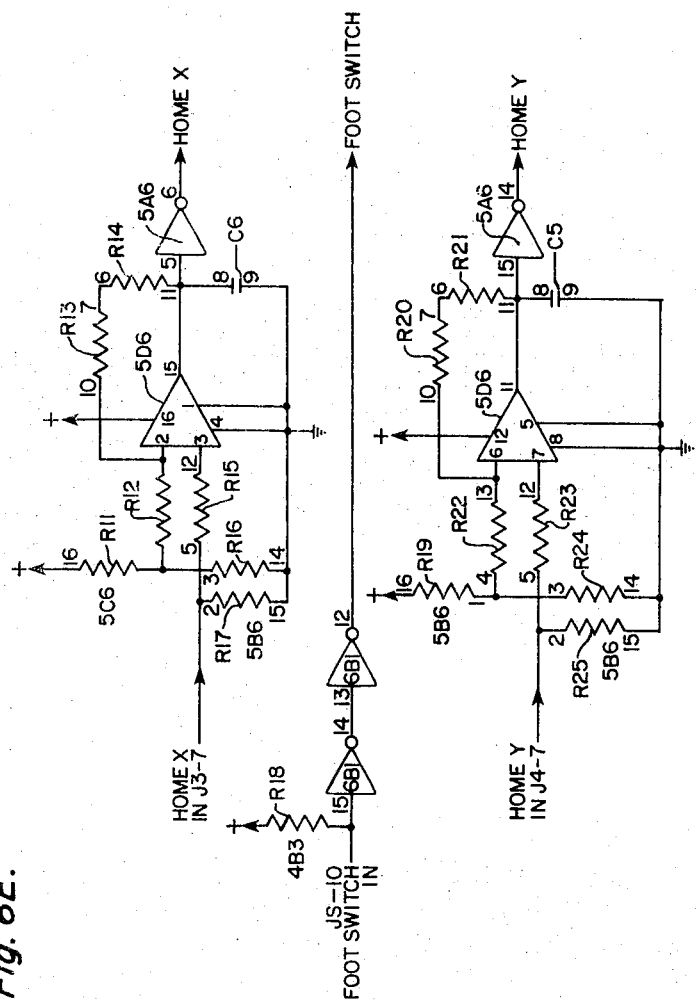
Figure 6D:
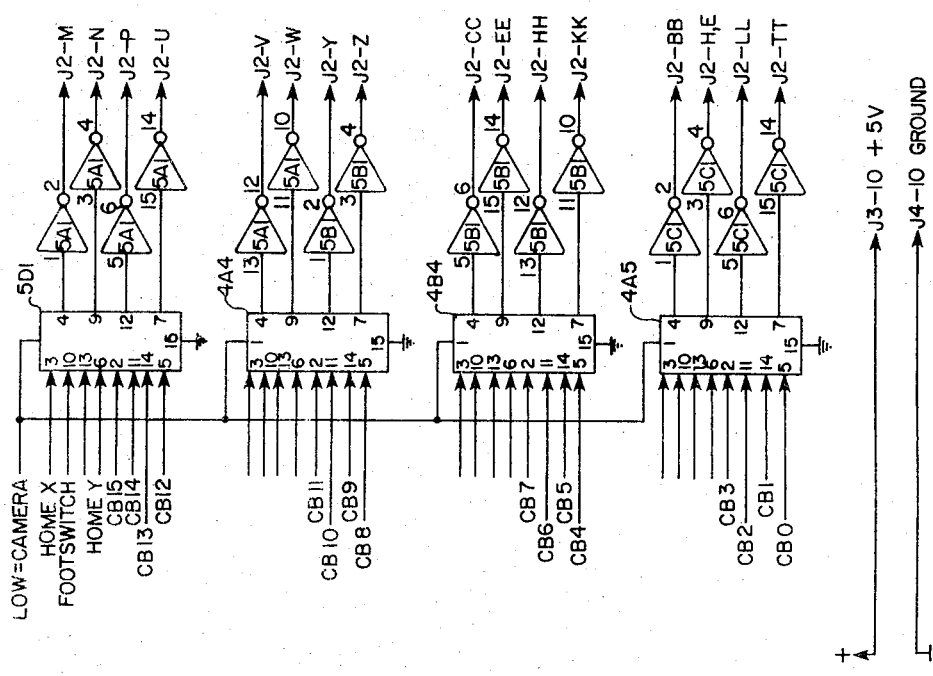
Figure 6F:
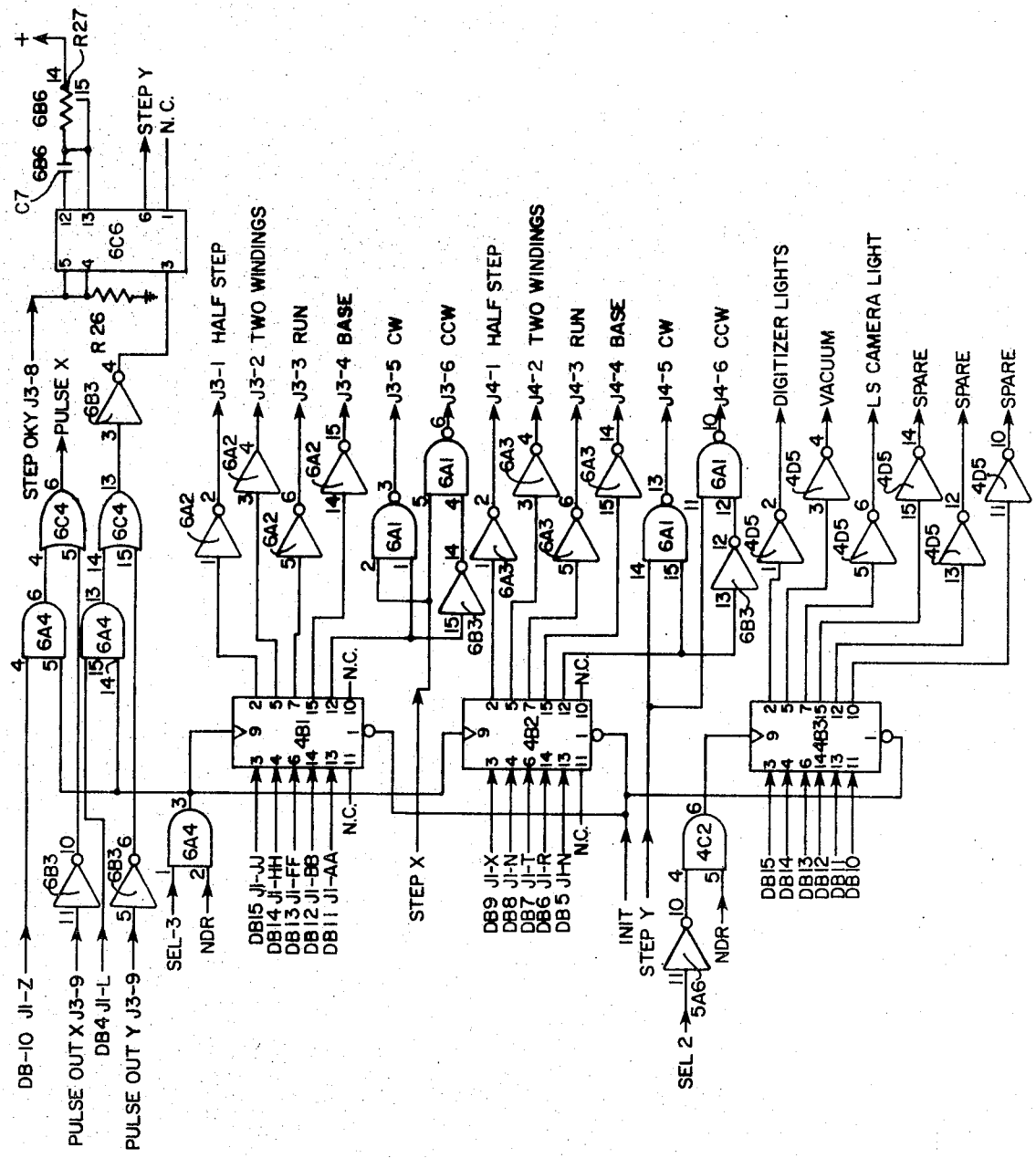
Figure 6G:
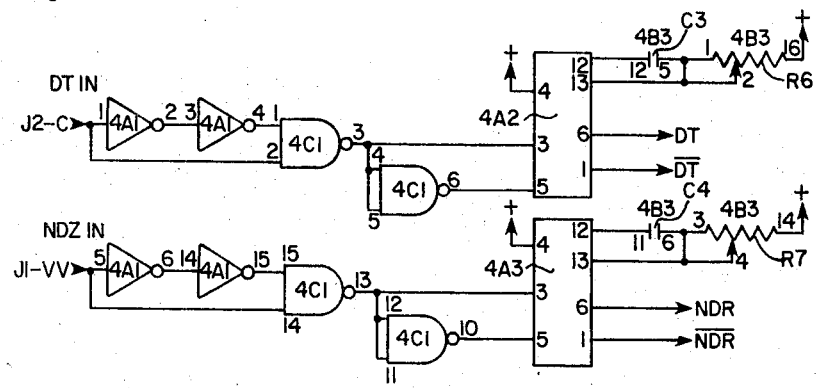
Figure 6H:
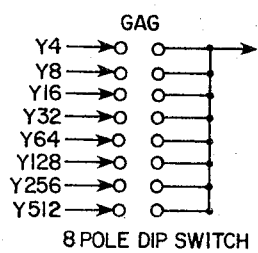
Figure 6I:
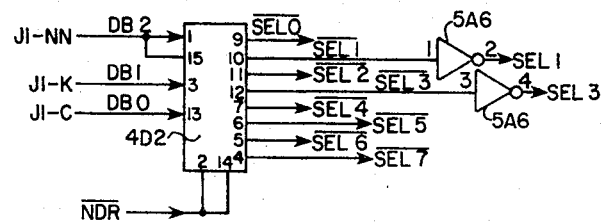
Figure 6J:
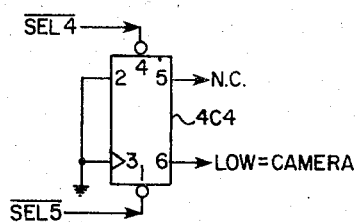
Figure 6K:
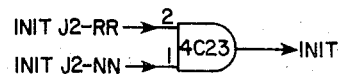
Figure 6L:

As indicated in the electrical schematic of FIG. 6G the DT and NDR signals received from the DRV11 card are buffered by amplifiers 4A1 (7404) and pulsed shaped through gate 4C1 (7400) and fed to a one shot multi-vibrator 4A2 or 4A3 (74121). The purpose is to make the DT or NDR pulse of a specific duration in order to guarantee operation of the electronic circuitry down stream.

The interrupt circuitry of the invention allows the interface 26 to tell the computer 28 that it has valid pending information for the computer. A control signal is generated by the line scan camera data word and is reset by the act of the computer passing the interrupt signal on to the computer and then the computer demanding the DRV11 card to read in the information and generate the signal DT.

The INIT signal is received from the DRV11 card and used to reset all of the functions/registers/latches in the interface 26 thereby guaranteeing correct starting positions or conditions. The signal is generated upon power up/re-boot of the system computer 28.

Data bits 0, 1 and 2 are connected to elements 4D2 (a 74155 dual two-line-to-four-line decoder/multiplexer configured as a one to eight line de-multiplexer). See FIG. 6I. When the input to element 4D2 is configured or manipulated as shown in FIG. 9, and gated by NDR, the conditioning output of element 4D2 is used as a gate/clock/reset signal which is part of the specific purpose of interface 26 as previously discussed.

Interface 26 provides properly generated signals to the stepping motor translator modules 42. The data bits illustrated in FIG. 9, are latched into elements 4B1 and 4B2 (7414) by the select three (SEL 3) signal from function decoder 4D2. See FIG. 6F. The output from element 4B1 and 4B2 are buffered by open collector drivers 6A1, 6A2, and 6A3 (7403, 7406 and 7407). Bits 11 and 5 as shown in FIG. 9 determine the direction (clockwise/counterclockwise) of the motors by the following logic: Logic 1=clockwise; Logic 0=counterclockwise. The output of the respective circuit 4B1 or 4B2 is fed to one input of a buffer 6A1 and the inverted signal is fed to a second gate input through amplifier 6B3. When the command to step (decoding bits 10 or 4) are received and logically ANDED with SEL 3, they trigger respectively one shot multivibrators 6C5 and 6C6 (7412). The output of 6C5 and 6C6 are fed to the other inputs of the 6A1 gates thereby causing their respective outputs to go true and driving the motor according to the conditions set up by the preceeding bits (15–12 and 9–6 in FIG. 9). The two 4B1 elements are reset by INIT on power up so that improper operating codes are not placed on the translator module 42 input. A maximum stepping rate of the motors is 3,000 steps per second.

Figure 10B:
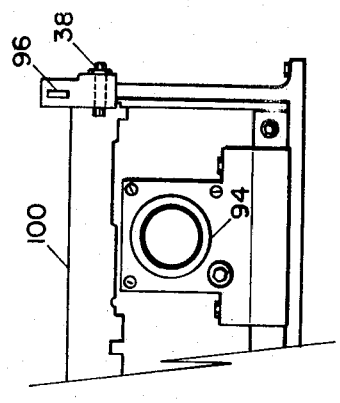
FIGS. 10A and 10B are side elevational views of the home sensor mechanism.
Figure 10A:
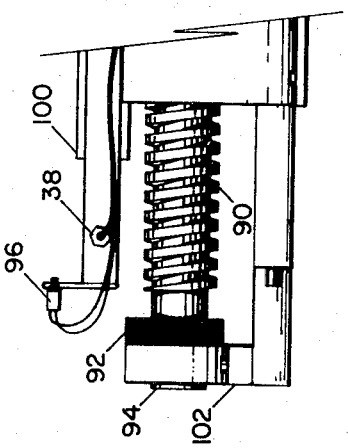

The operation of home sensors 38 can be best understood by reference to electrical schematic 6E and FIGS. 10A and 10B. Home position indicators 38 tell the interface 26 when X-Y table 46 is in an arbitrary center position within an accuracy of approximately ±0.0005". As shown in FIGS. 10A and 10B the sensor 38 is mounted in the outside frame casting 102 of X-Y table 46. The casting 102 also supports a bearing 94 which holds one end of lead screw 90. A rubber bumper 92 is employed to dampen impact against bearing 94. X-Y table 46 includes a movable top surface 100 which carries with it an element 96, such as a screw, which can be readily detected by sensor 38. In the preferred embodiment of the invention there are two sensors 38 and two targets 96 to respectively locate the home X and Y positions.

The proximity sensors 38 are Dennison Model No. NJ 1.5-8GM-N devices which include two wires connected through one of the retractable cords 88 to interface 26. One input from proximity device 38 is connected to a source of ±5 DC. The other input is connected through a resistor bias network to a voltage comparator 5D6 (LM 311 N) See FIG. 6E. When metal, such as target 96, is within 1.5 mm of sensor 38, the output of the voltage comparator is a logic 1. With no metal present the output from the comparator is a logic 0. This output is connected to the input of 5D1 (a 7425, quadruple 2-line-to-1-line data selector/multiplexor). See FIG. 6D. The output of 5D1 is controlled by the presence of either the home X signal, the home Y signal, the switchbox signal, the light fail signal or the camera data signal. When a selected input of the 5D1 is high, the other signals (home X, etc.) inputs are connected to data bus drivers 5A1 (7414). When low, the camera data path is connected directly through. Schematic illustration 6E shows the manner in which the voltage comparator 5D6 is employed to detect and shape the HOME X and HOME Y signals. FIG. 6D illustrates the manner in which the data, including the HOME X and HOME Y signals are multiplexed into the computer 28.

Figure 11B:
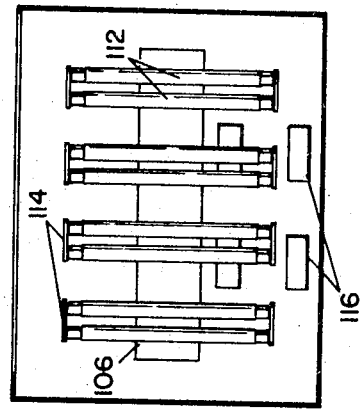
FIG. 11B is a top plan view of the digitizer pad illustrated in FIG. 11A.
Figure 11A:
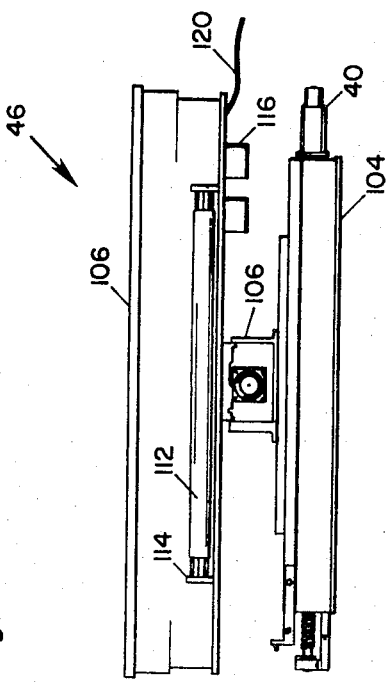
FIG. 11A is a side elevational view of the digitizer pad on top of the X-Y table.

FIGS. 11A and 11B illustrate the mechanical mounting of the fluorescent digitizer lights 36. According to the preferred embodiment eight fluorescent tubes 112 (General Electric Model Nos. F15T8-CW) and balasts 116 (General Electric Model Nos. 8G3912) are mounted inside an alumium box 110 that is fixed to the Y axis drive 106 of the X-Y table 46. Aluminum 46 preferred over materials such as plexiglass because aluminum has strength and thermal stability. Light box 110 supports a conventional digitizer pad 108. Y table 106 rests upon X table 104 which is driven by X drive motor 40. Fluorescent tubes 112 are mounted on tube sockets 114. A retractable power cord 120 provides the necessary electrical input to ballasts 116. The lights 112 may be kept on at all times for any purpose except while the line scan camera 14 is in its data accepting or reading mode. The 120 watt fluorescent light system 112 is turned on and off by controlling solid state relay 4C3 (G.E. Model No. CR120SR110Z) which is controlled by applying a TTL level signal to the plus or minus terminals on the control side. A logic 0 on pin 4 with pin 3 tied to plus 5 VDC causes the solid state, optically coupled/controlled output to apply 115 VAC to ballast 116 via retractable power cable 120.

Figure 12:
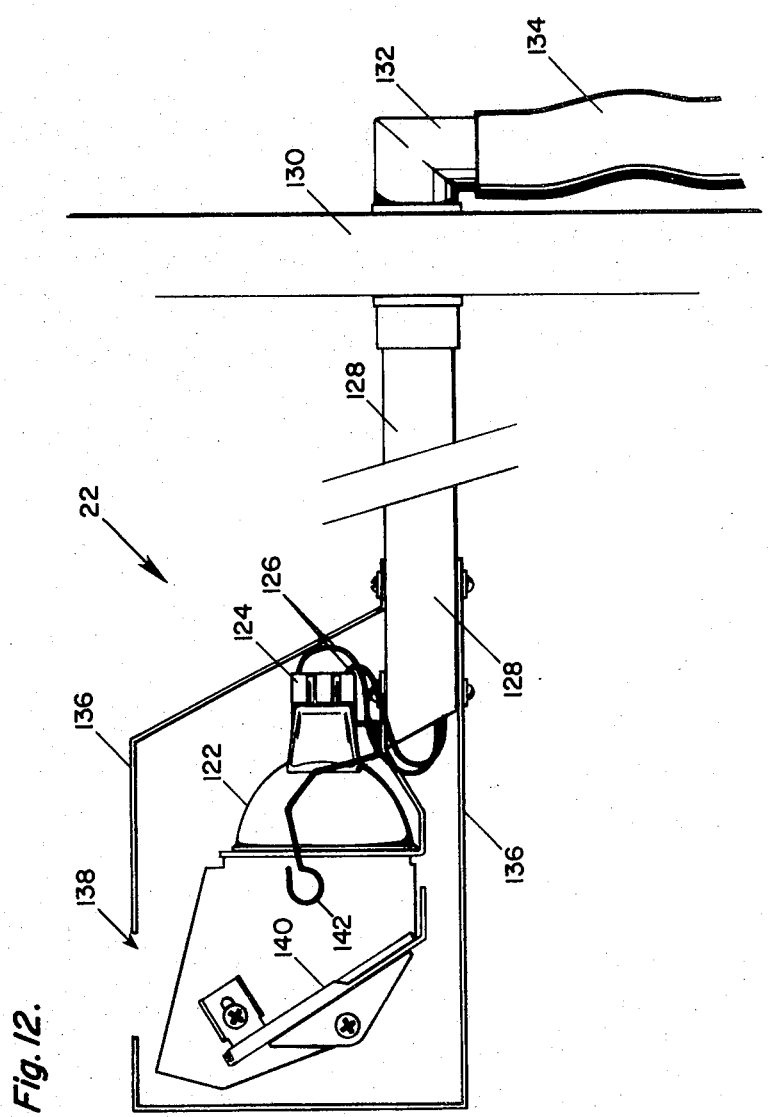
FIG. 12 is a side partial cross-sectional view of the line scan camera light mechanism.

The operation of the line scan camera light unit 22 and its control circuitry may be understood by referring to FIGS. 12 and 13. The line scan camera lamp 122 preferably comprises a 300 watt 120 VAC halogen light (G.E. Model No. ENH) housed inside of a special light box assembly 136. Lamp 122 is received in socket 124 which is mounted on a 1" square section of aluminum tubing 128. Aluminum tubing 128 is connected through the mainframe wall 130 by a bracket 132. Flexible hose 134 is connected to bracket 132 at one end and to a source of high vacuum at the other. Wires 126 connect the lamp 122 through aluminum tubing 128 and flexible hose 134 to the circuitry illustrated in FIG. 13.

The outside box 136 includes a light hole 138 through which the light from lamp 122 shines. Lamp 122 is further surrounded by an inner box 144 which houses an adjustable tilting mirror 140 which reflects the parallel beams from lamp 122 upward through light hole 138. Inner box 144 is mounted on aluminum tubing 128 and further includes a lamp bulb ejector/holder mechanism 142 which allows the lamp 122 to be ejected and replaced when necessary.

The purpose of assembly 22 is to supply the proper light intensity for the operation of line scan camera 14. A constant vacuum of one half inch and an air flow of 425 cu. ft. per minute must be maintained through lamp assembly 22 in order to cool the underside of the plexiglass clad digitizer pad 108. The digitizer pad 108 is covered on its top surface by $\frac{1}{8}$" of glass to make it more levelable as will be explained later. The intensity of lamp 122 is controlled by a variable output transformer 146. The variable output transformer 146 is in turn controlled by a solid state relay 148 which responds to the appropriate interface bit illustrated in FIG. 9. The digitizer light control signal is derived through component 4C3 and is designated as output signal J5-1 in FIG. 6F. A conventional electric plug 150 connects the lamp circuitry of FIG. 13 to a conventional source of 115 VAC.

The vacuum system 24 and its associated controls are illustrated in FIG. 14. The electronic control circuitry is similar to that described with reference to the operation of the line scan camera lamp 122 in FIG. 13. A solid state relay 152 responds to the appropriate data bit from the computer as illustrated in FIG. 9. The control signal comes from element 4C3 and is identified in FIG. 6F as output J5-2. Solid state relay 152 applies 115 VAC to conventional blower motor 154. A standard starting capacitor 156 is connected across motor 154. Motor 154 in turn is connected to a standard blower unit 158 which draws a vacuum of one half inch of air through flexible tubing 134 and lamp assembly 122 at a rate of 425 cu. ft. per minute. The motor is manufactured by Herbach and Rademan, Model No. TM20K070. The blower unit was manufactured by Lamb Electric, Model No. 15540.

Figure 4A:
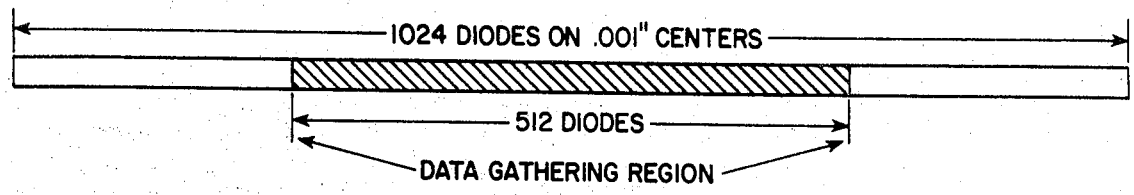
FIGS. 4A through 4D illustrates the manner in which the camera scans data points on the printed circuit mask.

The following is a description of the operation of the line scan data input formatter. The word or words received from line scan camera 14 are 1,024 serial bits long. A word is transmitted from the device at adjustable rates and is in synchronism with the camera clock and enable signals. The operation of the line scan data input/formatter can be understood by referring to the block diagram of FIG. 5 and the detailed electronic schematic illustrations of FIGS. 6A and 6B. Data from camera 14 is valid when the clocks enable signal is high or logic 1 and is invalid when the enable signal is low or logic 0. The camera clock signal is identified as input J5-8 and the camera enable signal is identified as J5-9 in FIG. 6A. The enable signal is only invalid long enough to allow the charge coupled diodes in line scan camera 14 to charge up to their respective amplitudes according to the amount of light (or lack of light) which falls upon them through camera lens 15. The camera lens 15 is a 100 mm–200 mm–300 mm zoom type lens manufactured by Canon, Model No. 61394. Lens 15 is mounted approximately 14 inches above the surface of digitizer pad 108. When computer 28 is ready to input information from line scan camera 14 it must be prepared to receive a block of information 512 bits wide by 200 bits long (102,400 bits). 1,024 bits times 200 lines are transmitted by the line scan camera 14, but only the center 512 are allowed to be transmitted to computer 28. Accordingly, there are 256 bits on each side of the center 512 bits which are not transmitted to the computer. The arrangement of the 512 center diodes is illustrated in FIG. 4A. Since the computer interface 26 can only accept information in parallel form, the interface of the present invention must format that data into a conventional 16 bit word. The formatting of the information into 16 bit words is accomplished through the coordination of the following sub-components illustrated in FIG. 5: Y counter 72; X counter 74; two 32 bit serial in/parallel out/shift register component 76 and 78, a dual 4-to-1 de-multiplexer 80 and a multiplexer control unit 82. Each of the foregoing sub-components operates as follows.

The Y counter 72 counts camera clock pulses. It inhibits data acceptance until the count of 256 is reached and then it allows data to be sent to the two 32 bit serial to parallel to shift registers 76 and 78. At a count of 768 (256 plus 512) it inhibits data transfer until the camera enable signal J5-9 becomes active again and the count reaches 256.

The X counter counts the number of Y scans completed and sends a control signal to multiplex control unit 82 when the count of 200 is reached. Note that the output of element 6C3 identified as X200 also serves as input to gate 6B2 in FIG. 6A. The count of 200 disables gate 6B2 and causes the circuit to ignore all other camera signals (i.e. from being recognized or being acted upon) until computer 28 commands another block of data to be read.

The two 32 bit shift register subcircuits comprise two groups of 4 shift registers each cascaded in a serial in-/parallel out fashion. The first group 76 comprises elements 5A2, 5A3, 5A4 and 5A5. The second group 78 comprises shift register elements 5B2, 5B3, 5B4 and 5B5. Information presented to the input of either 5A2 or 5B2 will be present on the last output of either 5A5 or 5B5 respectively 31 clock cycles later. When the 32nd clock cycle occurs the data path is changed so that the other set of shift registers receives the input. Accordingly, if the first group 76 is counting, the second group 78 will be dumping their output to multiplexer circuit 80 illustrated in FIG. 6B. Conversely, when the second group 78 is counting, the first group 76 will be dumping their output to the input of multiplexer 80.

Multiplexer 80, as illustrated in FIG. 6B, comprises eight 4-line-to-1 line data selectors controlled by a 2 line input from the circuit illustrated in FIG. 6C. The operation of the components of multiplexer 80 is similar to that of a single pole, 4 position switch such as illustrated in FIG. 15A. The output table relating to the single pole, 4 position switch of FIG. 15A is illustrated in FIG. 15B. All 64 outputs from the two shift register blocks 76 and 78 are placed onto the inputs of the eight elements that comprise multiplexer 80. The eight elements comprise 5C2, 5C3, 5C4, 5C5, and 5D2, 5D3, 5D4 and 5D5. The code input signals are received from the circuit illustrated in FIG. 6C on input ports 2 and 14 of the eight components respectively. A code of 00 will read the lower 16 bits of data from shift register 76 and a code of 01 will read the upper 16 bits of data from shift register 76. Similarly, a code of 10 will read the lower 16 bits of data from register 78 and a code of 11 will read the upper 16 bits of data from that register.

The multiplexer control unit 82 is illustrated in FIG. 6C. The purpose of control 82 is to receive and decode commands from computer 28. Control 82 also informs computer 28 when it has data available by signaling a request (REQ). It also generates the stepping commands for stepping motors 40.

The following is a brief description of the sequence of operation of the line scan camera data input formatter.

Initially computer 28 commands that it receive data input. The INIT signal is then applied to gate 6B2 as illustrated in FIG. 6A and to gate 62 illustrated in FIG. 6C. When the camera enable signal on line J5-9 goes true, clock pulses are transmitted to Y counter 72. When Y counter 72 reaches a count of 256 a pulse is sent to the X stepping motor 40 to move it one half step (see input signal Y256 to gate 6B2 in FIG. 6C) and clock pulses are sent to shift register groups 76 and 78. During the first 32 clock pulses after the count of 256 is reached, data is sent to shift register group 76. After Y=256+32 the next group of 32 bits is transmitted to and stored in shift register 78 as the output from group 76 is fed into multiplexer 80. First the lower 16 bits in shift register group 76 is multiplexed through unit 80 in response to a code of 00. When the code changes to 01, the upper 16 bits is multiplexed in parallel fashion into the computer DRV11 card. After shift register group 78 fills up with 32 bits the first set of shift register 76 begins to count from zero towards 32 again. A code of 10 reads out the lower 16 bits from shift register group 78 and then a code of 11 reads out the upper 16 bits from group 78. Each time the two digit binary code changes a group of 16 bits is presented in parallel fashion to the computer. These bits are read by the computer and processed or stored as necessary. The foregoing process continues until a count of Y768 is reached (256 plus 512). A pulse is then sent to the stepping motors to cause them to move another half step. Additionally a reset command is generated by the computer causing all functions of camera 14 to set. An important feature of the present invention is the fact that the stepping motors take a half step at count 256 and another half step at count 768. This feature insures that the scanning of the data is done in a smoother fashion than if a single jerky complete step were taken between reading scans.

Figure 17B:
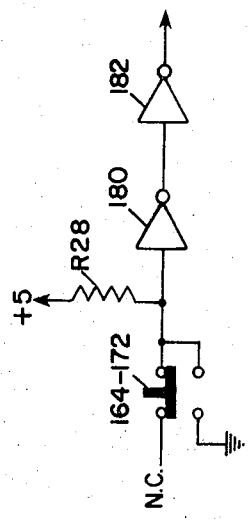
FIG. 17B is an electrical schematic of an individual switchbox pushbutton.
Figure 16:
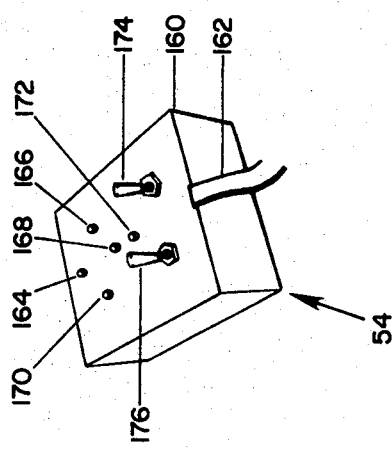
FIG. 16 is a perspective view of the table switch box.
Figure 17A:
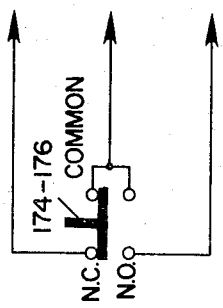
FIG. 17A is a schematic representation of the toggle switches of the switch box.

The table switch box 54 (TS Box) is a means of allowing the operator of the invention to move the X-Y Table 46. As illustrated in FIG. 16, the box 54 contains five normally open momentary contact pushbutton switches, namely elements 164, 166, 168, 170 and 172, and two toggle switches, namely elements 174 and 176. The toggle switches have three contacts respectively namely, common, normally open (N.O.) and normally closed (N.C.). Table switch box 54 includes a plexiglass case 160 which houses the control buttons. A flat cable 162 connects the switch box 54 to interface 26. Accordingly, each switch 164–176 and its signal is fed to computer 28 through the interface 26. When computer 28 commands information from the interface 26, and if a bit is true or set in the active state, the computer 28 knows that the operator wishes to move the X-Y Table 46 in an assigned direction or wishes to perform a function assigned to that particular switch. FIG. 17A is an electrical schematic of the wiring diagram of toggle switches 174 and 176. Similarly, FIG. 17B is an electrical schematic of the wiring diagram of each of the five pushbuttons 164, 166, 168, 170 and 172. Resistor R28 is a 4.7 Ohm resistor. Amplifiers 180 and 182 comprise serially connected 7414's.

Figure 18F:
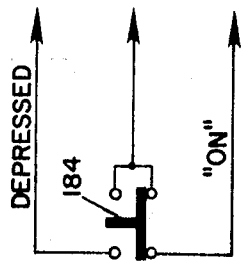
FIGS. 18A-18F illustrate the foot switch input mechanism and the associated electrical circuitry.
Figure 18D:
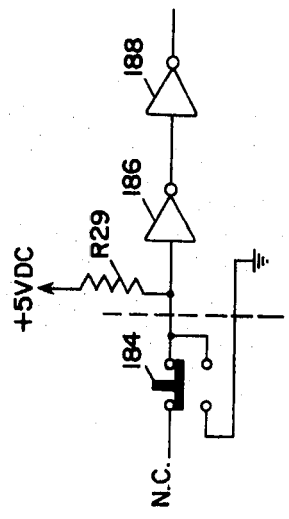
Figure 18E:
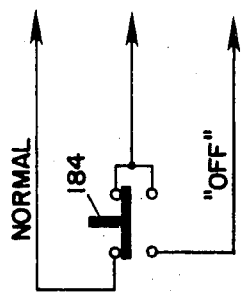
Figure 18A:
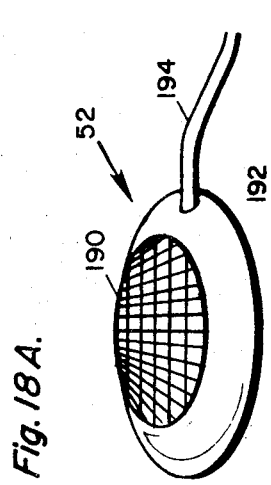
Figure 18B:
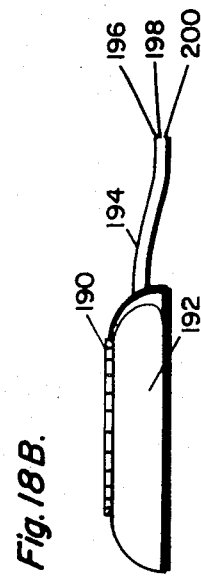
Figure 18C:
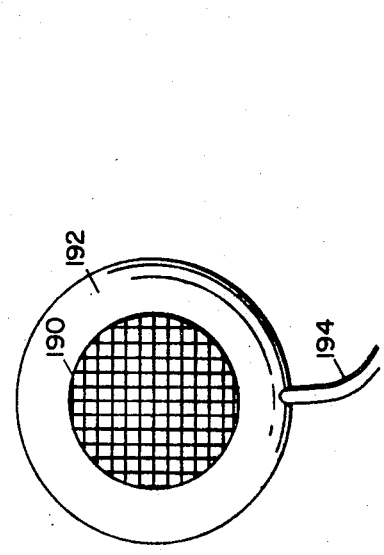

The purpose of footswitch 52 is to initiate functions during the hole sizing operation after the scanning operation is complete. The information is passed to computer 28 through the input multiplexer 80 of interface 26 when commanded. Footswitch 52 physically comprises a normally open switch having characteristics similar to the five pushbuttons of switch box 54. Note that the footswitch electrical schematic in FIG. 18D is virtually identical to the switch box pushbutton schematic of FIG. 17B. FIGS. 18E and 18F are merely details of the operation of switch 184 illustrated in the electrical schematic of FIG. 18D. Foot switch 52 physically comprises a rubber top 190 supported by a chrome plated base 192 having a rubber pad thereunder for stability. A three wire cord 194 connects the footswitch 52 to interface 26 through a common line 196, a normally open contact line (N.O.) 198 and a protective ground line 200. FIG. 18A illustrates footswitch 52 in a perspective view. FIGS. 18B and 18C illustrate footswtich 52 in side elevational views and top plan views respectively.

A light fail detector diode 210 informs computer 28 if the line scan camera lamp 122 is on when it is commanded to turn on. Detector 210 also informs the computer 28 that the light is on continuously during the lamp "on" cycle. A bundled fiberoptic cable 86 transmits light from outer box 136 to photodiode 210 (a Model No. TIL-99). The fiberoptic bundle 86 is also shown in FIGS. 8A and 8B. Similarly the details of the lamp assembly 22 are further described in FIG. 12. One end of fiberoptic bundle 86 is connected to outer lamp box 136 by a ferrule 202 and a back nut 204. The face of the fiberoptic bundle 86 located inside the lamp box 136 has a polished surface to increase the efficiency of the light received thereon. Photodiode 210 is received in a housing 207 and held in position at an appropriate mounting location, such as on interface 26, with a ferrule and back nut combination 205. The mechanical arrangement of the light fail detector mechanism 210 can be understood with reference to FIGS. 19A and 19B. The electrical arrangement of photodiode 210 is illustrated in the electrical schematic of FIG. 19C. Resistors R30 and R31 properly bias photodiode 210 for light activation. Amplifier 212 steps up the output from photodiode 210. Amplifier 212 comprises a 7407 integrated circuit. When lamp 122 is on, photodiode 210 conducts; when light 122 is off, photodiode 210 stops conducting. Computer 28 commands interface 26 to input the signal from photodiode 210 through input multiplexer 80.

3. Feature Recognition

Figure 4B:
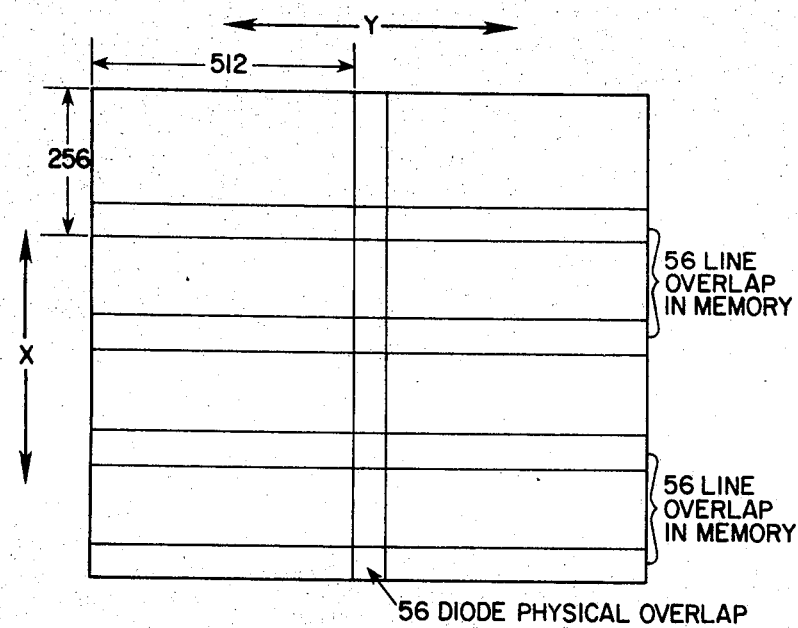
Figure 4C:
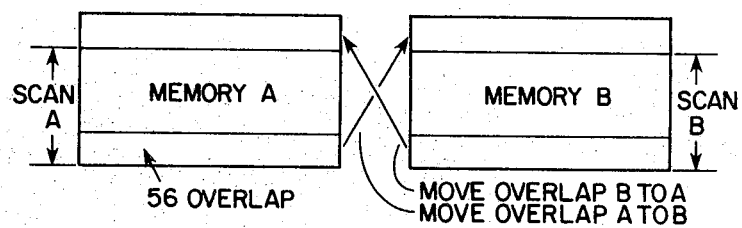

As previously discussed FIG. 4A illustrates a straight array of 1,024 diodes on centers 1/1000" apart. Only the center of 512 diodes are used for receiving information which is eventually transmitted to computer 28. The blocks of data accepted by computer 28 are 512 bits wide in the Y direction and 200 steps deep in the X direction. When the data is received in computer 28 it is treated in an overlapping fashion. The last 56 lines of one block of data (200 lines by 512 bits) are processed in conjunction with the first 56 lines of the next block of data. In other words two sequential scans in the X direction overlap in the computer memory by 56 scan lines. Similarly, the camera scans physically overlap by 56 bits in the Y direction. The overlap in the X and Y directions are illustrated schematically in FIG. 4B. The overlap in the Y direction is a physical, actual overlap, whereas the overlap in the X direction is an internal computer overlap as illustrated in FIG. 4C. Computer 68 includes an internal 64 K byte MOS memory having two sections, broken up by the program into a memory A and memory B. The purpose of the overlap analysis is to avoid missing holes on the edge of a scanning block. It also saves computer time by allowing one memory to fill with data while the data in the other memory is processed. The first block of data in memory A includes 56 lines of scan from a previous block of data in memory B and 200 lines of scanned data from a subsequent scan making a total of 131,072 (256 times 512) data bits in memory A. The last 56 lines of scan are subsequently shifted to the first 56 line scan locations in memory B which is augmented by a subsequent 200 lines of scan data. Accordingly, the last 56 lines of scan are always analyzed twice—once with their own group of data and next within the context of a subsequent group of data. In this manner holes which fall on the edge of a scanning pattern and which otherwise might fail examination are correctly identified. The overlap in the Y direction is achieved by physically moving the camera only 456 steps while scanning a path that is 512 steps long.

Figure 4D:
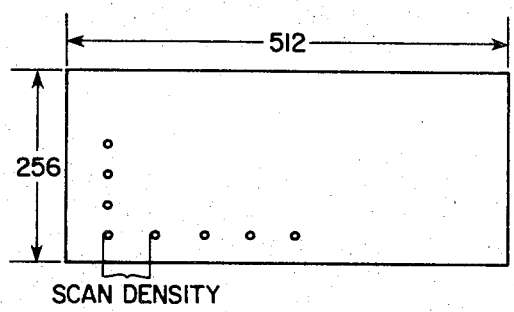

Once the scanned data is accumulated the next step is to determine what is of interest within that scan window which is 512 data points wide in the Y direction and 256 data points long in the X direction. A typical scan window is illustrated in FIG. 4D. During the period of investigation it is not necessary to sample every discrete point. Accordingly, a scanning density is chosen that is compatible with the objects to be identified. Scan density is usually defined as the minimum number expressed in thousands of samples that must be taken in the X and Y plane to find a particular object of interest. The number of sample points is therefore the following:

$$\frac{256}{N} \times \frac{512}{N} = \frac{131,072}{N^2}$$

wherein N=scan density

The scan density is picked to assure 2 hits per hole. For example if the minimum hole size is 16 thousanths of an inch, then a scan density (N) of 8 is chosen. Accordingly the invention will sample every eighth data point until it finds something of interest. Something of interest is defined as a 0-to-1 transition.

Figure 7A:
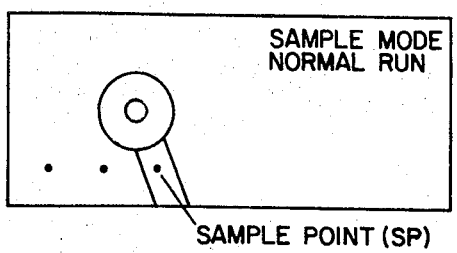
Figure 7B:
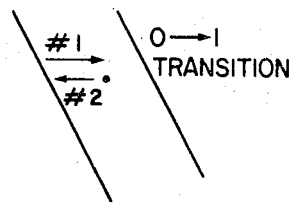

FIG. 7A illustrates what happens when the device detects something of interest, in this case the conductive lead to a contact point. First the device detects a 0-to-1 transition. Second the device samples each of the discrete data points between the 8 data points until it reaches an edge (a 1-to-0 transition). This is shown by arrow #2 in FIG. 7B. Third, the device then proceeds with three discrete tests to determine if the object encountered is a hole. According to the preferred embodiment of the invention, if the object to be detected is not a hole, it is not of interest. If the object tested failed to be a hole, then the normal scan of every eighth point is resumed.

The three tests used to determine if a hole is the object encountered are based upon a maximum diameter concept (MD). The maximum diameter concept starts with an assumption as to the maximum diameter hole that a user would expect to find plus some safety margin (usually 10 one thousanths of an inch). The concept states that if the point of interest (POI) is further away than the maximum diameter (MD) it must be an object that is not a hole. The three tests used in sequence are identified as follows:

1. BURST—a gross-quick test checking for objects that are too large to be a hole;
2. L-PATH—an intermediate complexity test to throw out lines of narrow enough width and angle to pass the coarser BURST test described above;
3. PATH—A sophisticated check looking for closure and examining for certain angular geometry that has not passed the L PATH test described above.

If the edge of the window, such as shown in FIG. 4D, is hit at any time a return to scan mode is resumed. The following is a more detailed description of the three hole detecting tests.

Figure 7C:
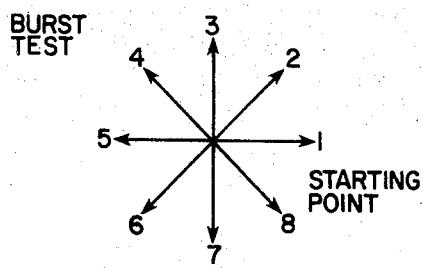

FIG. 7C illustrates the basic characteristics of the BURST test. The steps of the test are as follows:
1. Samples are taken at each data point in direction number 1 until either one of two things happens:
   i. MD is exceeded, in which case the device proceeds directly to the window scanning sampling mode; or,
   ii. A 1-to-0 transition is hit which indicates that the object being examined is within MD;
2. The test is performed in directions 2, 3, 4, 5, 6, 7 and 8. If an examination in any of those directions fail, the device automatically resumes its window scan sampling mode. As illustrated in FIG. 7C the eight sampling path directions are angled at 45° with respect to each other. The BURST test is a gross test which does not test each successive data point but instead tests each fifth data point, thereby saving time.

Figure 7D:
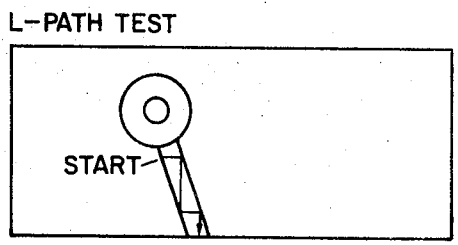
Figure 7E:
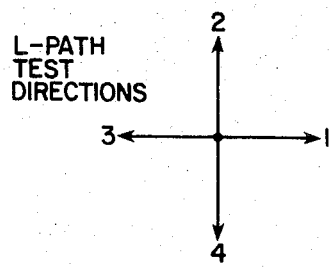
Figure 7F:
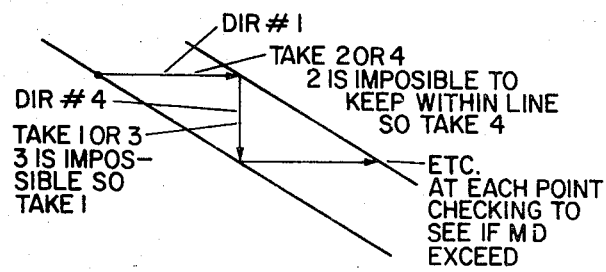
Figure 7G:
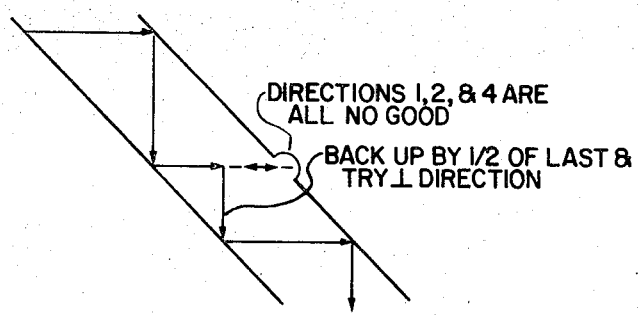

Details of the L PATH test are illustrated in FIGS. 7D–7G. The object of the L PATH test is to try to move the sampling point at least one MD away from the starting point within six moves. FIG. 7D illustrates a typical L-PATH test. FIG. 7G illustrates the four perpendicular directions which the L-PATH sampling point may take. According to the L-PATH test the sample point will follow a perpendicular line (either in directions 1, 2, 3 or 4) until it has either:
   i. Exceeded MD from its initial start position or,
   ii. Completed six perpendicular moves.

The specific steps will be more fully appreciated by referring to FIG. 7F as follows:
1. Beginning from the starting point proceed in direction number 1 until:
   i. an MD is exceeded - in which case the test is aborted and the window scan mode resumes; or,
   ii. An 0-to-1 transition is hit;
2. A perpendicular direction is chosen (there is usually only one perpendicular direction available, if neither perpendicular direction is available then the sampling point proceeds backwards along path 3- See FIG. 7G). For example, not in FIG. 7F that the testing point proceeds from the starting point in direction number 1 until it hits the boundary. The sample point then decides whether to take directions 2 or 4. Since 2 is impossible it proceeds along direction 4 until another 0-to-1 transition is hit. At that location it must choose between directions 1 or 3. Since 3 is impossible it must take 1. etc.
3. The procedure continues until MD is exceeded (in which case the device returns to the window scanning mode) or until it has made six moves (in which case it proceeds on to the PATH test).

Occasionally a sample point will be trapped within the geometry of a particular object in such a way that it is prevented from taking either one of the two opposing perpendicular alternative directions. Note in FIG. 7G that a sample point has become trapped within a small pocket which does not permit travel in either directions No. 1, 2 or 4. Accordingly the invention includes a feature that allows the sample point to back up in the direction from which it came by one half of the amount of its previous travel and then proceeds to attempt to move in either of the two perpendicular directions. The back up feature is necessary where geometry is relatively uneven. It is apparent from the foregoing that the L-PATH test is a more time consuming test than the BURST test.

The purpose of the PATH test (third test) is to attempt to follow the edge of an object. At any given density the sample point follows the edge starting at the starting point until either:
1. MD is exceeded (at which point the device returns to its normal window scan mode); or,
2. It returns to its starting point (in which case the object is declared to be a circle).

Figure 7H:
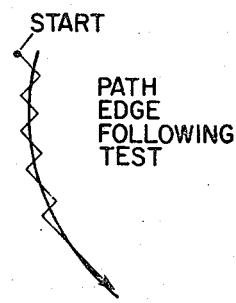

FIG. 7H illustrates in a graphic fashion the manner in which the sample point tests the edge of an object. As shown in FIG. 7I the PATH test is based upon a 9 point grid coordinate system. The starting point for any investigation is the middle, or fifth point. From the middle point there are eight possible directions which may be taken towards any one of the remaining eight points and those directions are represented by the arrows respectively numbered 1 through 8. The object of each investigation in the eight different directions is to find the next opposite the 0-to-1 or 1-to-0 crossing. The PATH test includes the following steps:
1. An investigation is made in the direction of line No. 1 (from point 5 to point 4). If no change of state from the last investigation is discovered (either 0-to-1 or 1-to-0) then another investigation is made in direction 2 (5-to-1). The investigation is continued until a change of state is noted;
2. The grid moves to the point of last change and repeats the investigation either until:
   i. MD is exceeded; or,
   ii. the point of investigation returns back to the starting point.

The last three positions are kept track of within the current nine point grid system. The current position is always defined as the fifth position and all changes in either of the eight different directions are defined in terms of the increment that must be added to the transformation in order to keep the fifth point at the origin of the grid. The transforms in the eight different directions are illustrated in Table 7J. Note for example that a move in direction 5 will cause the last point to be 4 because the current or new point is always defined as point 5.

The PATH test includes the following two additional rules for searching in closure:
1. The search point may not return to its previous next last sample point; and,
2. As shown in FIG. 7K the sample point may not cross a previous path.

The PATH test is clearly more sophisticated and time consuming than the L-PATH test which in turn is more sophisticated and time consuming than the rather gross BURST test previously described. The three tests are made in order, i.e. BURST, then L-PATH then PATH so that the more complicated, time consuming tests are only employed if there is a high degree of likelihood that the object being examined is a hole. The tests employed have been found to be highly reliable in the context of printed circuit board examination. The machine speed obtained by the three sequential tests is believed to be far superior to anything else presently available in the market or known to those of ordinary skill in the art.

4. Calibrations

In order to obtain maximum reliability it is first necessary to calibrate out certain undesirable errors. There are basically six errors which must be compensated for, namely element angle, TV alignment, digitizer table offset, surface offset, episolon (e) error of screw twist and Beta (1024 element twist). These errors are first determined before running the machine and then compensated for by computer 28.

Figure 20A:
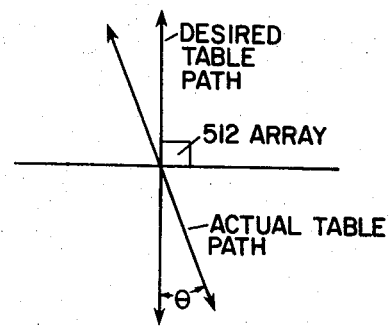
FIGS. 20A through 20G illustrate the 6 calibrations required prior to running the system.

FIG. 20A illustrate the offset angle theta which exists between the desired path of X-Y table 46 and the actual table path. The desired table path is, of course, at 90° to the 512 diode array in camera 14. The actual table path is offset by some angle theta from the desired table path. The angle theta must first be determined and then fed into computer 28 so as to eliminate the offset. Camera Lens 15 is typically located about 14 inches above the surface of digitizer pad 108.

Figure 20B:
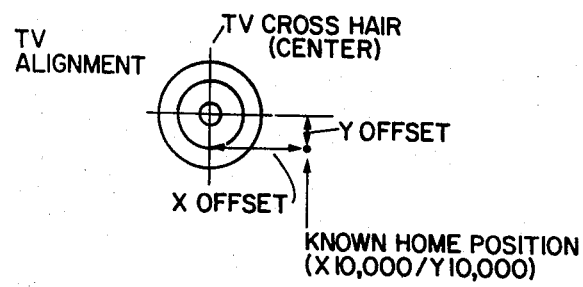

FIG. 20B illustrates the second type of error, namely, TV alignment error. The object is to align the center of the TV cross hairs with the center position of the X-Y table. The X-Y table 46 measures 20"×20" or 20,000 one thousandths of an inch in the X direction and 20,000 one thousandths of an inch in the Y direction. The known home position of the table is therefore at the exact center which is defined as the X=10,000 and Y=10,000 location. The error between the location of the center of the TV cross hairs and the actual home position of the table Y 10,000/X 10,000 is defined respectively as the X offset and Y offset. These values can be physically measured and must be fed into computer 28 in order to eliminate their influence on generated data.

Figure 20C:
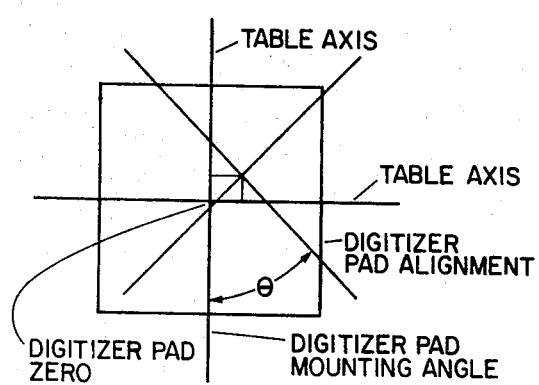
Figure 20D:
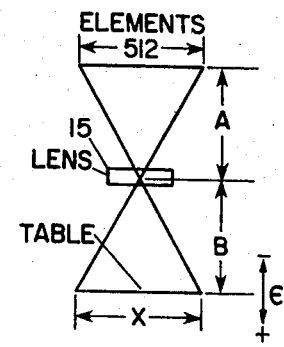

FIG. 20C illustrates the error that may be introduced between the X and Y tables 104 and 106 and the digitizer pad 108. See FIGS. 11A and 11B for machine details. The digitizer angle error is defined as the difference between the perpendicular axis of the X-Y table 46 and the perpendicular axis of the digitizer pad 108. Also the X-Y offsets of the digitizer pad may be found with respect to the X-Y table at the same time. The angle and the offsets can be physically measured and fed into computer 28 to counteract their influence on the subsequent calculations and steps.

FIG. 20B illustrates the problem inherent if the distance between the lens 15 of the line scan camera 14 and the surface of the digitizer pad 108 is not strictly maintained. The problem is: given distances A and B, and 512 target diodes set at centers of 1 one thousandths of an inch, what is the distance X? Preferably the distance X should be 0.512", however, in practice that is not always the case because the digitizer pad and/or camera may be misaligned. The distance X varies approximately as $$RSF = \frac{A}{B} \times 512$$

but the table is not level so $$RSF = \frac{A \pm c}{B} \times 512$$

for an e change in table surface to camera distance. The above formulas are reasonable approximations where the constants A and B are found by solving the equations for two known pairs of values.

Figure 20E:
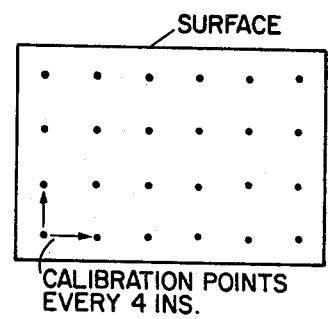

The value RSF is calculated while the machine is running. Preferably a grid of points, such as illustrated in FIG. 20E is measured using a micrometer attachment. The RSF at any point on the table is then interpolated and fed into computer 28 as an error adjustment parameter.

Figure 20F:
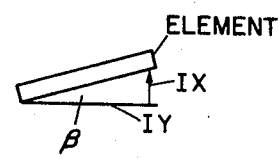

FIG. 20F illustrates the correction that must be made to compensate for the angular misalignment Beta between the diode array elements and the direction of scan. The Trigeometric relationship of FIG. 20E dictates that $$IX = -IY \sin Beta$$

This calibration is compensated for by scanning the same spot at different ends of the diode array. Therefore:

$$\frac{\text{delta } X}{\text{delta } Y} = \text{Tan Beta}$$

Compensation is accomplished by feeding this information into computer 28 and correcting the error.

Figure 20G:
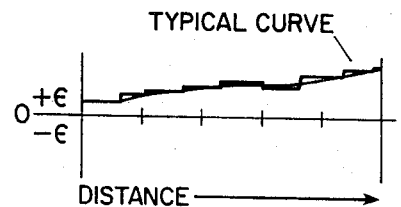

Finally, the sixth calibration is illustrated in FIG. 20G. The sixth calibration compensates for errors in the machining of the X-Y table lead screws. A typical screw has a grinding error in the neighborhood of 0.0015 inches/inch. Some screws are better. The screw twist compensation X1 is accomplished by placing a grid on the glass on top of digitizer pad 108 and then measuring the displacement on a regularly calibrated COORDINATO GRAPH of the sort used by Precision Photomasters of Mt. Holly, NJ. The foregoing system measures the accuracy of the lead screw used versus the calibrated grid and stores that information for each screw. During machine operation the curve of data is used to automatically reduce the grinding error in the screws. By this technique the error can be reduced to 0.0005 during the entire travel of the table. The curve in FIG. 20G illustrates the deviation from the ideal screw and the stepwise manner in which the device compensates for the deviation.

The six calibration tests just described are especially important because the data points are only one one thousandths of an inch apart. Therefore even minute errors can have a significant impact on the speed and accuracy of the machine if not adequately compensated for.

5. Computer Operation

Computer 28 is an integral part of the invention. It includes among its important features the ability to locate and eliminate duplicate data points, the performance of the BURST, L-PATH and PATH tests, the interfacing of the computer with the machine operator and the preparation of instructions to the tape reader-punch 50. According to the preferred embodiment a standard minicomputer is employed to perform the functions previously described. However, it will be appreciated by those of ordinary skill in the art that certain of the functions, such as the BURST test could also be "hard wired" into the electronics, thereby eliminating the use of a programmable computer. It will be also appreciated by those of ordinary skill in the art that a variety of different computers could be employed to perform the same function and that a variety of different programs could be used on the same computer or other computers to produce the sam results.

6. General Machine Operation

Figure 3:
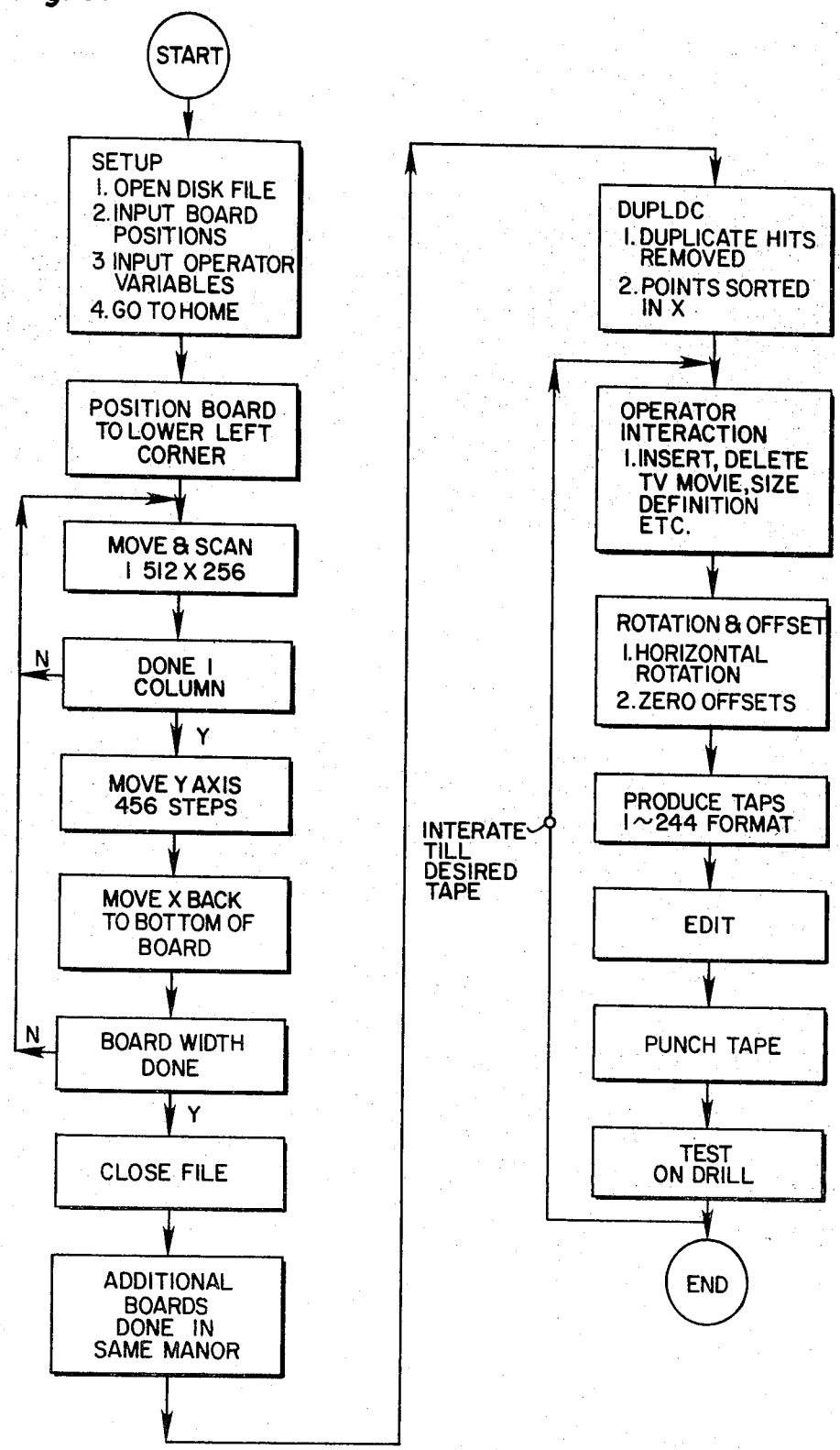
FIG. 3 is a flow chart illustrating the major steps in the operation of the apparatus.

The overall operation of the invention can be fully understood by referring to the flow chart of FIG. 3 and the following description of the steps. The start to finish steps are as follows:

1. The first printed circuit negative 66 is positioned upon digitizer pad 108 and secured there in the lower left position with tape. The six calibrations referred to in FIGS. 20A through 20G are then performed and that information is read into the computer 28.

2. The machine is set to run on program X1.

3. The four corners of each board on digitizer pad are located. The digitizer pad can accommodate up to four or more negatives. See FIG. 21 for an illustration of the manner in which a printed circuit board negative 66 is affixed to the surface of digitizer pad 108. Three points 302, 304 and 306 respectively are chosen to guide the operation of scanning camera 14.

4. The table is brought to the home position.

5. The camera 14 then goes to starting point 302 of board 300 and proceeds to scan the board in the manner illustrated in FIG. 4B.

6. Points are stored as they are encountered and the program is closed.

7. Run program DUPLDC;

8. Remove duplicates and sort data in X direction;

9. Operator selects one of several hole definition routines (A. encirclement, B. discrete hole or C. TV selection) -system performs specified operator functions.

10. Operator adds or deletes instructions until the image on CRT display 30 is correct and then the system performs the necessary functions to place that information in memory;

11. User selects terminate routine;

12. System inputs rotation and offset points into computer;

13. System sorts holes for most efficient back and forth path;

14. System prints out machine 244 tape;

15. User modifies tape as desired to reflect drill functions; and,

16. Steps 14 and 15 are repeated until desired tape is produced.

The following is a detailed description of the steps used by the invention to scan printed circuit board negatives:

1. Tape down the board within the outlined usable area.

2. Type on key board "run-DX1:X1" —this action will start the scanning program X1.

3. The CRT will display:

Default (1)=

The user will type a 1 (carriage return (cr)) indicating he wants the normal options.

4. The CRT will display:

Number Boards=

The user will indicate how many boards (up to 4) he has taped down and wishes to scan in this run of X1.

5. The CRT will display:

Select position of board #1

6. The user will put the digitizer in point mode by pressing button "A" until the red light next to "point" is on.

| 7. The CRT will display: | User Action: |
|---|---|
| Select upper left corner | Select point 1 |
| Select lower left corner | Select point 2 |

| 7. The CRT will display: | User Action: |
|---|---|
| Select low right corner | Select point 3 |

8. If a second (or 3rd or 4th) board were to be scanned Step 7 would be repeated for each board. This procedure tells the system what area to scan.

9. The system will scan each board first going to its home position. At the end of each board it will type the number of holes detected.

10. At the end of scanning all boards "stop—scan complete" will appear on the CRT First Pass Processing: The user types "RUN DUPLDC" the system will type the number of input holes and the final number after duplicate removal. The scanning program hits each hole at least twice to assure good recognition. After this program all multiple hits of the same hole are discarded.

The following is a detailed description of the board editing operation. Board editing refers to going through a set of choices by which the operator:

A. Assigns tool numbers to holes;

B. Inserts any missed or pinning holes;

C. Deletes any unwanted holes;

D. Inspects the board using the CRT or the TV for hole presence and tool number.

As shown in Table A the user may select any available letter and the system will perform that function. The choices under "Discrete" refer to interaction involving the cross hair or the pen. Either may be used with the digitizer in point mode.

| Function | Operation | |
|---|---|---|
| A | Assign = | The system will request "TOOL #=", the user may specify a #1-20. Each hole selected (by placing the cross hair or pen on that hole) will be given that tool #. A buzzer beeps once if a hole was found at that spot or twice if not found. Not found means the user was not accurate enough in selecting the hole. The user continues selecting holes until he decides to terminate. To do this he selects the terminate dot (see FIG. 21). This returns him to the Table A display. |
| B | Insert = | A hole is inserted at each point the cross hair or pen is postioned at. |
| C | Delete = | A hole, when selected, is deleted - if not found two beeps occur. |
| D | Examine = | A hole is selected and tool # currently assigned and displayed on the CRT. |
| E | Drive = | A hole is selected and the table is driven so that the holes drill position is under the TV cross-hairs. |

Encirclements choices refer to the holes contained in a circle drawn by the user using the digitizer cross hair cursor 62 or pen stylus 60.

| Function | Operation | |
|---|---|---|
| F | Assign = | A tool # is inputed. The digitizer is placed in "RUN"mode. The user draws a circle around a group of holes. All holes in the circle are given that particular tool #. The foot pedal 52 must be pressed during the entire act of encirclement. The user may draw many circles enclosing as few or as many holes as |

-continued

| Function | | Operation |
|---|---|---|
| | | desired. To exit this choice of functions the user puts the pen 60 or cursor 62 at the terminate dot (see FIG. 21) and presses the foot switch 52. |
| G | Delete = | Similar to choice F. The holes encircled are deleted. |
| H | Examine = | Similar to choice F. The holes encircled are counted and displayed on CRT 30 by tool size. (i.e. 5 holes of size 1, 2 holes of size 2, etc.) |

"MANUAL", on Table A refers to TV monitor interaction. When using this mode the button box 54 of FIG 16 is used to manipulate the table 46.

The bottom two toggle switches 176 and 176 control "RUN-JOG". "RUN" means go as long as a direction button is pressed; "JOG" means go a discrete amount for each button press. "SLOW-FAST" in "RUN" is for speed, in "JOG" it is length of motion. The direction buttons 164, 166, 168 and 170 refer to the direction the scanning surface is to move in. Exit button 172 is used as an abort or terminate button.

| Function | | Operation |
|---|---|---|
| J | Insert = | The user first specifies a tool number using the button box 54 to manipulate the X-Y table 46 to put the desired point (insert a hole) under the TV cross hair. Pressing the foot switch 52 inserts the hole. The exit button aborts the insert. |
| K | Examine = | This operation displays tool size of hole the user has put under the cross hair. |

TABLE A

| | Discrete | Encirclement | Manual |
|---|---|---|---|
| Assign | A | F | — |
| Insert | B | — | J |
| Delete | C | G | — |

TABLE A-continued

| Examine | D | H | | K |
| Drive | E | — | | — |
| Summary | M | | Run | R |
| Display | N | | | |
| Control | P | | Input | S |
| Terminate | Q | | Punch | Z |

Other Choices:

| Function | | Operation |
|---|---|---|
| M | Summary = | A summary of hole sizes appears on the CRT. |
| R | Run = | User specifies a tool number. The system moves each hole with that tool number under the TV cross hair, the user at this point may go on to the next, go back to Table A, change tool number, delete the hole or move the hole using switch box 54. |
| P | Control = | Go to the control display. |
| Z | Punch = | Punch the tape image that has already been processed. |
| Q | Terminate = | The steps in terminating are: |
| | | 1. Stop processing (hold) - if the user stops he loses nothing and may return at any time to where he left off. |
| | | 2. Select feeds and speeds - the system will display its current feed rate and spindle speed for each tool. If any are to be changed the operator does it here via a simple prompting interaction. |
| | | 3. Exit or put out tape choice - if an exit is performed the user may want to edit his tape using the "editor" to put in commands such as repeats, axis reversals, etc. He may re-start DC and use option "Z" to punch his edited tape. |
| N | Display = | Discussed below: |

"Display" is a mode where the user can interact with the terminal and see graphically what is occurring. In this mode the button box 54 is used to move the Active Point (AP) around the screen. The function buttons (See FIG. 22) are used to select the desired action as follows.

| Button | | Function |
|---|---|---|
| 1 | Exit = | Exit present mode and go back to Table A. |
| 2 | New Display = | Display hole positions on the CRT The size is set such that the maximum viewing area of the CRT is used. |
| 3 | Delete = | Delete the point closest to the AP. |
| 4 | Move TV = | Move the table such that the hole nearest the AP is put under the TV cross hair. |
| 5 | Display Tool Size = | The system will request tool number and display using progressively larger dots to indicate the hole positions of that tool size. This function may be performed in conjunction with the function of Table A. in which case large dots will be the selected tool size and small dots all others. Alternatively, it may be performed with the page button (FIG. 22) which erases the screen so that the screen will only display holes of the specific tool number. |
| 6 | Move Cursor = | This defines the current location of AP by causing it to blink on the CRT and by producing an audible beep. The user may then move the AP by using the button box 54. Upon pressing the exit button another function button may be selected. |

-continued

| Button | Function | |
|---|---|---|
| 7 | Change Tool Number = | The user may specify a tool number and the closest point to AP will be assigned that number. |
| 8 | Move & Replace = | Delete the hole closest to AP and move the X-Y table 46 to a new position using the button box 54 hitting the switch 52 when done. |
| 9 | Incr Scale = | Increase the current sacle. The area immediately around AP will be expanded on the CRT. |
| 0 | Reset Scale = | The expansion of Function 9 will be reset |

7. Routing Feature

It is possible to use the apparatus described to produce instructions for a routing machine. For example, the device has been used on occasion to scan a negative outline of a pair of glasses for the purpose of producing machine instructions to produce the necessary eyeglass blanks for further finishing. This application can be especially useful in the eyeglass business where a wide variety of custom made frames must be kept in stock. The device can be used to produce instructions for a routing machine because it has the capability of accurately recognizing the borders of an object.

8. Inspecting Feature

It is often highly desirable to compare a drilled printed circuit board with a master negative for the purpose of determining and graphically displaying errors in the position and size of certain features such as holes. The invention can be employed to perform the inspection of a drilled board by performing the following steps:

1. The INSPECT program is fed into the machine from a program diskette.
2. The user then places the diskette of the master negative into the machine for reference. The master negative has previously been scanned and processed to identify specific features such as holes;
3. The drilled printed circuit board is arbitrarily placed on the X-Y table and scanned in the manner previously described with reference to the dimensioning operation of the invention;
4. The user then identifies the alignment of the board by specifying a first matching hole on the CRT 30 and then setting the TV 18 at the same point. The same sequence is then followed for a second reference point. All actions taken by the user in this regard are prompted on CRT 30; and,
5. After the machine has made the comparison, the user may produce either one of the following outputs:
    (a) A print or display report of the absolute position of the holes or other features of the board which fall within certain limits.
    (b) A print or graphic display report of all diameters within certain limits.

9. Conclusion

The invention just described is considerably more reliable and between 4 and 10 times faster than those known in the prior art. The unique advantages of the present invention are in part due to the unique manner in which the device can detect holes by eliminating hole candidates through a progression of tests. If a hole candidate is not eliminated by the BURST test it is then examined according to the parameters of the L-PATH test and finally, if it passes the PATH test it is counted as a hole. While the operations can be performed on a suitable mini-computer such as that described in the preferred embodiment of the invention, it will be appreciated that certain functions could be speeded up by hard wiring standard components to perform any or all of the hole tests. It will be further appreciated by those of ordinary skill in the art that the device described is capable of scanning virtually anything for the purpose of producing machine instructions.

The mounting of the digitizer pad 108 directly upon the X-Y table 46 increases the correlation between the physical and apparent location of the X and Y point on the table. It has also been found that the interaction between CRT 12 and line scan camera 14 greatly improves the ability of the machine operator to monitor the progress of the scanning operation.

The reliability of the device has also been improved by stepping the table in half steps at the 256 and 712 diode locations. Two half steps have been found to be superior to one full step in that they greatly reduce the jerky motion of X-Y table 46.

To a certain extent scanning density and speed are inter-dependent. By reducing scanning density it is possible to perform machine operations at higher speed. The accuracy of the device is further enhanced by the performance of the six calibration steps described in FIGS. 20A-20G.

While the foregoing has been described with respect to the preferred embodiment thereof, it will be understood by those of ordinary skill in the art that various changes can be made to the structure, function of the parts and steps of the invention without departing from the spirit and scope thereof.

We claim:
1. An automatic dimensioning apparatus for scanning an object and producing machine instructions, said apparatus comprising:
    means for supporting said object;
    scanner means for scanning said object and producing an electrical output representative thereof, said scanner means scanning said object in a series of paths with overlapping portions;
    recognition means for detecting the location of specific predetermined features of said object;
    a duplication rejection means for eliminating duplicate features detected more than once at a specific location;
    a display means for displaying the location of said detected features;
    manipulating means for specifying machine functions at the location of certain of said detected features; and, means responsive to said manipulating means and said recognition means for producing machine instructions.

2. The apparatus of claim 1 including a first test means for testing a feature of said object by investigating its maximum diameter in at least one radial direction from a specific starting point.

3. The apparatus of claim 2 further including:
a second test means for examining a feature of said object by means of a sample point which investigates the dimensions of an object in a series of perpendicular steps, said second test means also including a back up means for backing up said sample point when said sample point cannot move in a direction of 90° with respect to its last successive direction of travel.

4. The apparatus of claim 3 further including:
a third test means for examining a feature of said object by causing a sample point to explore the edge of said feature.

5. The apparatus of claim 4 further including:
drive means for driving said means for supporting said object; and,
means for advancing said drive means at least twice between successive scans of said scanner means.

6. The apparatus of claim 5 further including:
means for reducing the angular error between the desired path for said means for supporting said object and the actual path of said means for supporting said object.

7. The apparatus of claim 6 further including:
means for reducing the X and Y offset error between said display means and said means for supporting said object.

8. The apparatus of claim 7 further including:
means for reducing the angular and offset error between said drive means and said means for supporting said object.

9. The apparatus of claim 8 further including:
means for reducing the optical error between said scanner means and the surface of said object.

10. The apparatus of claim 9 further including:
means for reducing the twist error between the means for supporting said object and the scanner means.

11. The apparatus of claim 10 further including:
means for reducing the screw machining error in said drive means.

12. A method for scanning an object and producing machine instructions with respect thereto, said method comprising the steps of:
scanning said object and producing an output representative thereof;
detecting the location of specific predetermined features of said object, said detecting step including the step of applying a first test to a feature of said object by examining the dimension of said feature in at least one radial direction to determine if that feature exceeds a certain maximum diameter standard;
specifying machine functions at the location of certain of said detected features; and,
producing machine instructions at the location of said certain detected features.

13. The method of claim 12 further including the step of:
applying an intermediate second test, if said feature passes said first step, said second test including an examination of said feature in a series of paths perpendicular to each other.

14. The method of claim 13 further including the step of:
applying a third, more comprehensive test to said feature, if said feature passes said first and second tests, said third test including an examination of the edge of said feature to determine if said feature is closed.

15. The method of claim 14 further including the step of:
advancing said object at least twice between scanning steps.

16. The method of claim 15 further including the steps of:
compensating for the angular error between the desired path of a means for supporting said object and the actual path of said means for supporting said object.

17. The method of claim 16 further including the step of:
compensating for the error between a display means and said means for supporting said object.

18. The method of claim 17 further including the step of:
compensating for the angular and offset error between a means for driving said object and said means for supporting said object.

19. The method of claim 18 further including the step of:
compensating for the optical error between a means for scanning said object and said object.

20. The method of claim 19 further including the step of:
compensating for the twist error between the means for supporting said object and the means for scanning said object.

21. The method of claim 20 further including the step of:
compensating for the screw machining error in said means for driving said object.

22. An automatic inspecting apparatus for scanning a first object and comparing certain features of said first object to certain features of a second object, said apparatus comprising:
means for supporting said first object;
means for scanning said first object and producing a first set of scan data representative thereof;
processing means for processing said first set of scan data to detect said certain features of said first object, said processing means producing a first set of processed data representative of said features of said first object, said first set of processed data being smaller in volume than said first set of scan data;
comparison means for comparing said first set of processed data against a pre-stored second set of processed data representative of said certain features of said second object and producing an electrical output representative of said comparison; and,
reporting means for producing an output representative of the output from said comparison means.

23. A method of scanning an object and comparing it to a master negative, said method comprising the steps of:
scanning said master negative and producing a first set of scan data;

detecting the location of specific predetermined features on said master negative by processing said first set of scan data and producing a first set of processed data representative of said features, said first set of processed data being smaller in volume than said first set of scan data;

storing said first set of processed data;

scanning means object and producing a second set of scan data;

detecting the location of specific predetermined features on said object by processing said second set of scan data and producing a second set of processed data representative of predetermined features on said object, said second set of processed data being smaller in volume than said second set of scan data;

comparing said first set of processed data representative of specific predetermined features of said master negative against said second set of processed data representative of features of said object; and, producing an output which is representative of the error between the specific predetermined features of said master negative and said object.

24. An automatic inspecting apparatus for scanning an object representative of a first printed circuit board, recognizing features on said object and comparing a first set of processed data representative of features found on said object to a stored set of processed data representative of features of a second printed circuit board, said apparatus comprising:

charge coupled scanning means for scanning said object representative of said first printed circuit board and producing scan data representative thereof;

feature recognition means responsive to said scan data representative of said first printed circuit board for comparing said scan data against a set of definitions and for detecting the location of specific predetermined features of said object representative of said first printed circuit and for producing a first set of processed data representative of the predetermined features of said first printed circuit board, said processed data being smaller in volume than said scan data, comparison means for comparing said first set of processed data against said stored set of processed data representative of features of said second printed circuit board; and, reporting means for producing an output representative of the output of said comparison means.

* * * * *